United States Patent
Proctor, Jr. et al.

(10) Patent No.: US 8,078,100 B2
(45) Date of Patent: *Dec. 13, 2011

(54) PHYSICAL LAYER REPEATER WITH DISCRETE TIME FILTER FOR ALL-DIGITAL DETECTION AND DELAY GENERATION

(75) Inventors: James A. Proctor, Jr., Melbourne Beach, FL (US); Kenneth M. Gainey, Satellite Beach, FL (US); Carlos M. Puig, Santa Clara, CA (US); James C. Otto, West Melbourne, FL (US); Lawrence W. LaMont, Jr., Indialantic, FL (US)

(73) Assignee: QUALCOMM Incorporated, San Diego, CA (US)

( * ) Notice: Subject to any disclaimer, the term of this patent is extended or adjusted under 35 U.S.C. 154(b) by 1466 days.

This patent is subject to a terminal disclaimer.

(21) Appl. No.: 11/340,860

(22) Filed: Jan. 27, 2006

(65) Prior Publication Data

US 2006/0195883 A1 Aug. 31, 2006

Related U.S. Application Data

(63) Continuation-in-part of application No. 10/533,589, filed as application No. PCT/US03/35050 on Nov. 17, 2003, and a continuation-in-part of application No. 10/531,078, filed as application No. PCT/US03/291030 on Oct. 15, 2003, now Pat. No. 8,060,009.

(60) Provisional application No. 60/647,385, filed on Jan. 28, 2005, provisional application No. 60/426,541, filed on Nov. 15, 2002.

(51) Int. Cl.
*H04B 7/15* (2006.01)
(52) U.S. Cl. .................... 455/11.1; 455/339
(58) Field of Classification Search .............. 455/7, 9, 455/11.1, 15, 16, 18, 24, 67.11, 67.16, 85, 455/552.1, 307, 339; 370/315, 320, 328
See application file for complete search history.

(56) References Cited

U.S. PATENT DOCUMENTS

| | | | |
|---|---|---|---|
| 3,363,250 A | 1/1968 | Jacobson |
| 4,000,467 A | 12/1976 | Lentz |
| 4,001,691 A | 1/1977 | Gruenberg |
| 4,061,970 A | 12/1977 | Magneron |
| 4,081,752 A | 3/1978 | Sumi |
| 4,124,825 A | 11/1978 | Webb et al. |

(Continued)

FOREIGN PATENT DOCUMENTS

CN 1186401 7/1998

(Continued)

OTHER PUBLICATIONS

Kutlu et al., "Performance Analysis of MAC Protocols for Wireless Control Area Network," 1996 IEEE, pp. 494-499.

(Continued)

*Primary Examiner* — Quochien B Vuong
(74) *Attorney, Agent, or Firm* — Linda G. Gunderson

(57) ABSTRACT

A discrete time bandpass filter element (103) having multiple stages (201, 202, 203, 204, 205) for use in a time division duplex radio protocol communications system including an automatic gain control. Discrete time bandpass filter is used to generate delay and can replace SAW filters in a wireless frequency translating repeater.

22 Claims, 13 Drawing Sheets

U.S. PATENT DOCUMENTS

| | | |
|---|---|---|
| 4,204,016 A | 5/1980 | Chavannes |
| 4,334,323 A | 6/1982 | Moore |
| 4,368,541 A | 1/1983 | Evans |
| 4,509,206 A | 4/1985 | Carpe et al. |
| 4,679,243 A | 7/1987 | McGeehan et al. |
| 4,701,935 A | 10/1987 | Namiki et al. |
| 4,723,302 A | 2/1988 | Fulmer et al. |
| 4,777,653 A | 10/1988 | Bonnerot et al. |
| 4,783,843 A | 11/1988 | Leff et al. |
| 4,820,568 A | 4/1989 | Harpell et al. |
| 4,922,259 A | 5/1990 | Hall et al. |
| 5,023,930 A | 6/1991 | Leslie |
| 5,095,528 A | 3/1992 | Leslie et al. |
| 5,214,788 A | 5/1993 | Delaperriere et al. |
| 5,220,562 A | 6/1993 | Takada et al. |
| 5,280,480 A | 1/1994 | Pitt et al. |
| 5,333,175 A | 7/1994 | Ariyavisitakul et al. |
| 5,341,364 A | 8/1994 | Marra et al. |
| 5,349,463 A | 9/1994 | Hirohashi et al. |
| 5,368,897 A | 11/1994 | Kurihara et al. |
| 5,371,734 A | 12/1994 | Fischer et al. |
| 5,373,503 A | 12/1994 | Chen et al. |
| 5,383,144 A * | 1/1995 | Kato ............................ 708/313 |
| 5,408,197 A | 4/1995 | Miyake |
| 5,408,618 A | 4/1995 | Aho et al. |
| 5,430,726 A | 7/1995 | Moorwood et al. |
| 5,446,770 A | 8/1995 | Urabe et al. |
| 5,465,251 A | 11/1995 | Judd et al. |
| 5,471,642 A | 11/1995 | Palmer |
| 5,485,486 A | 1/1996 | Gilhousen et al. |
| 5,509,028 A | 4/1996 | Marque-Pucheu et al. |
| 5,515,376 A | 5/1996 | Murthy et al. |
| 5,519,619 A | 5/1996 | Seda |
| 5,608,755 A | 3/1997 | Rakib |
| 5,610,916 A | 3/1997 | Kostreski et al. |
| 5,648,984 A | 7/1997 | Kroninger et al. |
| 5,654,979 A | 8/1997 | Levin et al. |
| 5,659,879 A | 8/1997 | Dupuy |
| 5,676,198 A | 10/1997 | Schneider et al. |
| 5,678,177 A | 10/1997 | Beasley |
| 5,684,801 A | 11/1997 | Amitay et al. |
| 5,697,052 A | 12/1997 | Treatch et al. |
| 5,726,980 A | 3/1998 | Rickard |
| 5,732,334 A | 3/1998 | Miyake |
| 5,745,846 A | 4/1998 | Myer et al. |
| 5,754,540 A | 5/1998 | Liu et al. |
| 5,764,636 A | 6/1998 | Edsall et al. |
| 5,767,788 A | 6/1998 | Ness |
| 5,771,174 A | 6/1998 | Spinner et al. |
| 5,784,683 A | 7/1998 | Sistanizadeh et al. |
| 5,794,145 A | 8/1998 | Milam et al. |
| 5,812,933 A | 9/1998 | Niki |
| 5,815,795 A | 9/1998 | Iwai |
| 5,825,809 A * | 10/1998 | Sim ............................... 375/350 |
| 5,852,629 A | 12/1998 | Iwamatsu et al. |
| 5,857,144 A | 1/1999 | Mangum et al. |
| 5,862,207 A | 1/1999 | Aoshima |
| 5,875,179 A | 2/1999 | Tikalsky et al. |
| 5,883,884 A | 3/1999 | Atkinson |
| 5,884,181 A | 3/1999 | Arnold et al. |
| 5,890,055 A | 3/1999 | Chu et al. |
| 5,903,553 A | 5/1999 | Sakamoto et al. |
| 5,907,794 A | 5/1999 | Lehmusto et al. |
| 5,963,846 A | 10/1999 | Kurby et al. |
| 5,963,847 A | 10/1999 | Ito et al. |
| 5,987,304 A | 11/1999 | Latt |
| 6,005,855 A | 12/1999 | Zehavi et al. |
| 6,005,884 A | 12/1999 | Cook et al. |
| 6,014,380 A | 1/2000 | Hendel et al. |
| 6,032,194 A | 2/2000 | Gai et al. |
| 6,061,548 A | 5/2000 | Reudink et al. |
| 6,088,570 A | 7/2000 | Komara et al. |
| 6,101,400 A | 8/2000 | Ogaz et al. |
| 6,108,364 A | 8/2000 | Weaver et al. |
| 6,128,512 A | 10/2000 | Trompower et al. |
| 6,128,729 A | 10/2000 | Kimball et al. |
| 6,163,276 A | 12/2000 | Irving et al. |
| 6,188,694 B1 | 2/2001 | Fine et al. |
| 6,188,719 B1 | 2/2001 | Collomby |
| 6,195,051 B1 | 2/2001 | McCoy et al. |
| 6,202,114 B1 | 3/2001 | Dutt et al. |
| 6,215,982 B1 | 4/2001 | Trompower et al. |
| 6,219,739 B1 | 4/2001 | Dutt et al. |
| 6,222,503 B1 | 4/2001 | Gietema et al. |
| 6,272,351 B1 | 8/2001 | Langston et al. |
| 6,285,863 B1 | 9/2001 | Zhang |
| 6,298,061 B1 | 10/2001 | Chin et al. |
| 6,304,563 B1 | 10/2001 | Blessent et al. |
| 6,304,575 B1 | 10/2001 | Carroll et al. |
| 6,331,792 B1 | 12/2001 | Tonietto et al. |
| 6,339,694 B1 | 1/2002 | Komara et al. |
| 6,342,777 B1 | 1/2002 | Takahashi et al. |
| 6,363,068 B1 | 3/2002 | Kinoshita et al. |
| 6,370,185 B1 | 4/2002 | Schmutz et al. |
| 6,370,369 B1 | 4/2002 | Kraiem et al. |
| 6,377,612 B1 | 4/2002 | Baker et al. |
| 6,377,640 B2 | 4/2002 | Trans et al. |
| 6,384,765 B1 | 5/2002 | Sjostrand et al. |
| 6,385,181 B1 | 5/2002 | Tsutsui et al. |
| 6,388,995 B1 | 5/2002 | Gai et al. |
| 6,393,299 B1 | 5/2002 | Mizumoto et al. |
| 6,404,775 B1 | 6/2002 | Leslie et al. |
| 6,441,781 B1 | 8/2002 | Rog et al. |
| 6,473,131 B1 | 10/2002 | Neugebauer et al. |
| 6,480,481 B1 | 11/2002 | Park et al. |
| 6,501,955 B1 | 12/2002 | Durrant et al. |
| 6,535,732 B1 | 3/2003 | McIntosh et al. |
| 6,539,028 B1 | 3/2003 | Soh et al. |
| 6,539,204 B1 | 3/2003 | Marsh et al. |
| 6,549,542 B1 | 4/2003 | Dong et al. |
| 6,549,567 B1 | 4/2003 | Fullerton et al. |
| 6,563,468 B2 | 5/2003 | Hill et al. |
| 6,574,198 B1 | 6/2003 | Petersson |
| 6,628,624 B1 | 9/2003 | Mahajan et al. |
| 6,664,932 B2 | 12/2003 | Sabet et al. |
| 6,671,502 B1 | 12/2003 | Ogawa |
| 6,684,058 B1 | 1/2004 | Karacaoglu et al. |
| 6,690,657 B1 | 2/2004 | Lau et al. |
| 6,694,125 B2 | 2/2004 | White et al. |
| 6,718,160 B2 | 4/2004 | Schmutz et al. |
| 6,728,541 B2 | 4/2004 | Ohkura et al. |
| 6,766,113 B1 | 7/2004 | Al-Salameh et al. |
| 6,781,544 B2 | 8/2004 | Saliga et al. |
| 6,788,256 B2 | 9/2004 | Hollister |
| 6,880,103 B2 | 4/2005 | Kim et al. |
| 6,888,881 B1 | 5/2005 | Nagano |
| 6,904,266 B1 | 6/2005 | Jin et al. |
| 6,906,669 B2 | 6/2005 | Sabet et al. |
| 6,934,511 B1 | 8/2005 | Lovinggood et al. |
| 6,934,555 B2 | 8/2005 | Silva et al. |
| 6,944,139 B1 | 9/2005 | Campanella et al. |
| 6,957,042 B2 | 10/2005 | Williams et al. |
| 6,983,162 B2 | 1/2006 | Garani et al. |
| 6,985,516 B1 | 1/2006 | Easton et al. |
| 6,990,313 B1 | 1/2006 | Yarkosky et al. |
| 7,027,418 B2 | 4/2006 | Gan et al. |
| 7,027,770 B2 | 4/2006 | Judd et al. |
| 7,043,203 B2 | 5/2006 | Miquel et al. |
| 7,050,442 B1 | 5/2006 | Proctor et al. |
| 7,050,452 B2 | 5/2006 | Sugar et al. |
| 7,058,071 B1 | 6/2006 | Myles et al. |
| 7,058,368 B2 | 6/2006 | Nicholls et al. |
| 7,088,734 B2 | 8/2006 | Newberg et al. |
| 7,103,344 B2 | 9/2006 | Menard et al. |
| 7,120,930 B2 | 10/2006 | Maufer et al. |
| 7,123,670 B2 | 10/2006 | Gilbert et al. |
| 7,123,676 B2 | 10/2006 | Gebara et al. |
| 7,132,988 B2 | 11/2006 | Yegin et al. |
| 7,133,391 B2 | 11/2006 | Belcea et al. |
| 7,133,460 B2 | 11/2006 | Bae et al. |
| 7,139,527 B2 | 11/2006 | Tamaki et al. |
| 7,167,526 B2 | 1/2007 | Liang et al. |
| 7,187,904 B2 | 3/2007 | Gainey et al. |
| 7,193,975 B2 | 3/2007 | Tsutsumi et al. |
| 7,194,275 B2 | 3/2007 | Bolin et al. |
| 7,200,134 B2 | 4/2007 | Proctor, Jr. et al. |
| 7,215,964 B2 | 5/2007 | Miyake et al. |

| | | |
|---|---|---|
| 7,233,771 B2 | 6/2007 | Proctor, Jr. et al. |
| 7,248,645 B2 | 7/2007 | Vialle et al. |
| 7,254,132 B2 | 8/2007 | Takao et al. |
| 7,299,005 B1 | 11/2007 | Yarkosky et al. |
| 7,315,573 B2 | 1/2008 | Lusky et al. |
| 7,319,714 B2 | 1/2008 | Sakata et al. |
| 7,321,787 B2 | 1/2008 | Kim et al. |
| 7,339,926 B2 | 3/2008 | Stanwood et al. |
| 7,352,696 B2 | 4/2008 | Stephens et al. |
| 7,406,060 B2 | 7/2008 | Periyalwar et al. |
| 7,409,186 B2 | 8/2008 | Van Buren et al. |
| 7,430,397 B2 | 9/2008 | Suda et al. |
| 7,450,936 B2 | 11/2008 | Kim et al. |
| 7,457,587 B2 | 11/2008 | Chung |
| 7,486,929 B2 | 2/2009 | Van Buren et al. |
| 7,577,398 B2 | 8/2009 | Judd et al. |
| 7,590,145 B2 | 9/2009 | Futch et al. |
| 7,623,826 B2 | 11/2009 | Pergal et al. |
| 7,676,194 B2 | 3/2010 | Rappaport et al. |
| 7,729,669 B2 | 6/2010 | Van Buren et al. |
| 2001/0018328 A1 | 8/2001 | Ohkura et al. |
| 2001/0031646 A1 | 10/2001 | Williams |
| 2001/0040699 A1 | 11/2001 | Osawa et al. |
| 2001/0050580 A1 | 12/2001 | O'Toole et al. |
| 2001/0050906 A1 | 12/2001 | Odenwalder et al. |
| 2001/0054060 A1 | 12/2001 | Fillebrown et al. |
| 2002/0004924 A1 | 1/2002 | Kim et al. |
| 2002/0018487 A1 | 2/2002 | Chen et al. |
| 2002/0034958 A1 | 3/2002 | Oberschmidt et al. |
| 2002/0045461 A1 | 4/2002 | Bongfeldt |
| 2002/0061031 A1 | 5/2002 | Sugar et al. |
| 2002/0089945 A1 | 7/2002 | Belcea et al. |
| 2002/0101843 A1 | 8/2002 | Sheng et al. |
| 2002/0102948 A1 | 8/2002 | Stanwood et al. |
| 2002/0109585 A1 | 8/2002 | Sanderson |
| 2002/0115409 A1 | 8/2002 | Khayrallah et al. |
| 2002/0119783 A1 | 8/2002 | Bourlas et al. |
| 2002/0136268 A1 | 9/2002 | Gan et al. |
| 2002/0141435 A1 | 10/2002 | Newberg et al. |
| 2002/0146026 A1 | 10/2002 | Unitt et al. |
| 2002/0155838 A1 | 10/2002 | Durrant et al. |
| 2002/0159506 A1 | 10/2002 | Alamouti et al. |
| 2002/0163902 A1 | 11/2002 | Takao et al. |
| 2002/0177401 A1 | 11/2002 | Judd et al. |
| 2003/0026363 A1 | 2/2003 | Stoter et al. |
| 2003/0063583 A1 | 4/2003 | Padovani et al. |
| 2003/0139175 A1 | 7/2003 | Kim et al. |
| 2003/0179734 A1 | 9/2003 | Tsutsumi et al. |
| 2003/0185163 A1 | 10/2003 | Bertonis et al. |
| 2003/0211828 A1 | 11/2003 | Dalgleish et al. |
| 2003/0235170 A1 | 12/2003 | Trainin et al. |
| 2003/0236069 A1 | 12/2003 | Sakata et al. |
| 2004/0029537 A1 | 2/2004 | Pugel et al. |
| 2004/0038707 A1 | 2/2004 | Kim et al. |
| 2004/0047333 A1 | 3/2004 | Han et al. |
| 2004/0047335 A1 | 3/2004 | Proctor, Jr. et al. |
| 2004/0110469 A1 | 6/2004 | Judd et al. |
| 2004/0121648 A1 | 6/2004 | Voros |
| 2004/0131025 A1 | 7/2004 | Dohler et al. |
| 2004/0146013 A1 | 7/2004 | Song et al. |
| 2004/0157551 A1 | 8/2004 | Gainey et al. |
| 2004/0166802 A1 | 8/2004 | McKay, Sr. et al. |
| 2004/0176050 A1 | 9/2004 | Steer et al. |
| 2004/0198295 A1 | 10/2004 | Nicholls et al. |
| 2004/0208258 A1 | 10/2004 | Lozano et al. |
| 2004/0218683 A1 | 11/2004 | Batra et al. |
| 2004/0229563 A1 | 11/2004 | Fitton et al. |
| 2004/0235417 A1 | 11/2004 | Dean |
| 2004/0248581 A1 | 12/2004 | Seki et al. |
| 2004/0264511 A1 | 12/2004 | Futch et al. |
| 2005/0014464 A1 | 1/2005 | Larsson et al. |
| 2005/0030891 A1 | 2/2005 | Stephens et al. |
| 2005/0042999 A1 | 2/2005 | Rappaport et al. |
| 2005/0130587 A1 | 6/2005 | Suda et al. |
| 2005/0190822 A1 | 9/2005 | Fujii et al. |
| 2005/0201315 A1 | 9/2005 | Lakkis et al. |
| 2005/0254442 A1 | 11/2005 | Proctor, Jr. et al. |
| 2005/0256963 A1 | 11/2005 | Proctor, Jr. et al. |
| 2005/0286448 A1 | 12/2005 | Proctor et al. |
| 2006/0028388 A1 | 2/2006 | Schantz |
| 2006/0035643 A1 | 2/2006 | Vook et al. |
| 2006/0041680 A1 | 2/2006 | Proctor, Jr. et al. |
| 2006/0045193 A1 | 3/2006 | Stolpman et al. |
| 2006/0052066 A1 | 3/2006 | Cleveland et al. |
| 2006/0052099 A1 | 3/2006 | Parker et al. |
| 2006/0056352 A1 | 3/2006 | Proctor, Jr. et al. |
| 2006/0063484 A1 | 3/2006 | Proctor et al. |
| 2006/0063485 A1 | 3/2006 | Gainey et al. |
| 2006/0098592 A1 | 5/2006 | Proctor, Jr. et al. |
| 2006/0183421 A1 | 8/2006 | Proctor et al. |
| 2006/0203757 A1 | 9/2006 | Young et al. |
| 2006/0262026 A1 | 11/2006 | Gainey et al. |
| 2007/0025349 A1 | 2/2007 | Bajic |
| 2007/0025486 A1 | 2/2007 | Gainey et al. |
| 2007/0032192 A1 | 2/2007 | Gainey et al. |
| 2007/0121546 A1 | 5/2007 | Zuckerman et al. |
| 2007/0286110 A1 | 12/2007 | Proctor et al. |
| 2008/0057862 A1 | 3/2008 | Smith et al. |
| 2008/0233942 A9 | 9/2008 | Kim et al. |

FOREIGN PATENT DOCUMENTS

| | | |
|---|---|---|
| EP | 0523687 | 1/1993 |
| EP | 0709973 A1 | 5/1996 |
| EP | 0715423 | 6/1996 |
| EP | 0847146 A2 | 6/1998 |
| EP | 0853393 A1 | 7/1998 |
| EP | 0860953 | 8/1998 |
| GB | 2272599 | 5/1994 |
| GB | 2351420 A | 12/2000 |
| JP | 62040895 | 2/1987 |
| JP | 63160442 | 7/1988 |
| JP | 64011428 | 1/1989 |
| JP | 02100358 | 4/1990 |
| JP | 03021884 | 1/1991 |
| JP | 05063623 | 3/1993 |
| JP | 05102907 | 4/1993 |
| JP | 06013947 | 1/1994 |
| JP | 06334577 | 12/1994 |
| JP | 07030473 | 1/1995 |
| JP | 7079187 A | 3/1995 |
| JP | 07079205 | 3/1995 |
| JP | 07131401 | 5/1995 |
| JP | 8097762 A | 4/1996 |
| JP | 08274706 | 10/1996 |
| JP | 09018484 A | 1/1997 |
| JP | 09130322 | 5/1997 |
| JP | 09162801 | 6/1997 |
| JP | 9162903 A | 6/1997 |
| JP | 09182155 | 7/1997 |
| JP | 09214418 | 8/1997 |
| JP | 10032557 A | 2/1998 |
| JP | 10107727 | 4/1998 |
| JP | 10135892 | 5/1998 |
| JP | 10242932 A | 9/1998 |
| JP | 11055713 | 2/1999 |
| JP | 11127104 | 5/1999 |
| JP | 11298421 | 10/1999 |
| JP | 2000031877 | 1/2000 |
| JP | 2000502218 T | 2/2000 |
| JP | 2000082983 A | 3/2000 |
| JP | 2000236290 | 8/2000 |
| JP | 2000269873 | 9/2000 |
| JP | 2001016152 | 1/2001 |
| JP | 2001111575 A | 4/2001 |
| JP | 2001136115 | 5/2001 |
| JP | 2001244864 A | 9/2001 |
| JP | 2002033691 | 1/2002 |
| JP | 2002111571 A | 4/2002 |
| JP | 2002271255 | 9/2002 |
| JP | 2003174394 | 6/2003 |
| JP | 2003198442 | 7/2003 |
| JP | 2003244050 | 8/2003 |
| JP | 2004056210 | 2/2004 |
| JP | 2004328666 | 11/2004 |
| JP | 2004538682 | 12/2004 |
| JP | 2005072646 | 3/2005 |
| JP | 2005110150 | 4/2005 |
| JP | 2005236626 | 9/2005 |

| | | |
|---|---|---|
| JP | 2005531202 | 10/2005 |
| JP | 2005531265 | 10/2005 |
| JP | 2006503481 | 1/2006 |
| JP | 2006505146 | 2/2006 |
| JP | 2006197488 A | 7/2006 |
| KR | 20040004261 A | 1/2004 |
| KR | 100610929 | 8/2006 |
| RU | 2120702 C1 | 10/1998 |
| WO | WO9214339 | 8/1992 |
| WO | WO9715991 | 5/1997 |
| WO | WO9734434 | 9/1997 |
| WO | WO9858461 A1 | 12/1998 |
| WO | WO9959264 | 11/1999 |
| WO | WO0050971 A2 | 8/2000 |
| WO | WO0152447 | 7/2001 |
| WO | WO0182512 | 11/2001 |
| WO | WO0199308 | 12/2001 |
| WO | WO0208857 A2 | 1/2002 |
| WO | WO0217572 A2 | 2/2002 |
| WO | WO03013005 | 2/2003 |
| WO | 2004002014 | 12/2003 |
| WO | WO2004001892 | 12/2003 |
| WO | WO2004001986 A2 | 12/2003 |
| WO | WO2004002014 | 12/2003 |
| WO | WO2004004365 | 1/2004 |
| WO | WO2004032362 | 4/2004 |
| WO | WO2004036789 | 4/2004 |
| WO | WO2004038958 | 5/2004 |
| WO | WO2004062305 A1 | 7/2004 |
| WO | WO2005115022 | 12/2005 |

OTHER PUBLICATIONS

IEEE Std 802.11b-1999, "Part 11: Wireless LAN Medium Access Control (MAC) and Physical Layre (PHY) specifications: Higher-Speed Physical Layer Extension in the 2.4 GHz Band," IEEE-SA Standards Board, Supplement to ANSI/IEEE Std. 802.11, 1999 Edition, Approved Sep. 16, 1999.
IEEE Std 802.11g-2003, "Part 11: Wireless LAN Medium Access Control (MAC) and Physical Layer (PHY) specifications: Amendment 4: Further Higher Data Rate Extension in the 2.4 GHz Band," IEEE Computer Society, Published by The Institute of Electrical and Electronics Engineers, Inc., Jun. 27, 2003.
IEEE Std 802.16-2001; "Part 16: Air Interface for Fixed Broadband Wireless Access Systems," IEEE Computer Society and the IEEE Microwave Theory and Techniques Society, Published by The Institute of Electrical and Electronics Engineers, Inc., Apr. 8, 2002.
International Search Report for the corresponding International application No. PCT/US06/02899 dated Apr. 6, 2007.
International Preliminary Report on Patentability issued from PCT in corresponding PCT application No. PCT/US2006/002899 dated Jul. 31, 2007.
Office Action English translation dated Jul. 4, 2008 issued from Chinese Patent Office for Application No. 03814391.7.
Office Action English translation dated Jun. 29, 2009 issued from Japanese Patent Office for Application No. 2004-541532.
Translation of Office Action in Japanese application 2004-515701, corresponding to U.S. Appl. No. 10/516,327, citing WO00050971, JP2000-031877, JP2002-033691, JP2002-111571 and JP11-127104. Dated May 25, 2010.
Translation of Office Action in Japanese application 2004-544751, corresponding to U.S. Appl. No. 10/531,078, citing W000050971, JP2002-111571, JP05-102907, JP63-160442, JP2000-502218, JP10-032557 and JP2000-082983. Dated Aug. 25, 2009.
Translation of Office Action in Japanese application 2004-553510, corresponding to U.S. Appl. No. 10/533,589, citing W000050971, JP09-182155, JP09-182155, JP64-011428 and JP62-040895. Dated Sep. 29, 2009.
Translation of Office Action in Japanese application 2004-565505, corresponding to U.S. Appl. No. 10/563,471, citing JP08-097762 and JP2001-111575. Dated Aug. 11, 2009.
Translation of Office Action in Japanese application 2004-565505, corresponding to U.S. Appl. No. 10/563,471, citing JP08-097762, JP2001-111575, JP09-018484 and JP11-055713. Dated Sep. 14, 2010.
Translation of Office Action in Japanese application 2004-565505, corresponding to U.S. Appl. No. 10/563,471, citing JP09-018484. Dated Feb. 23, 2010.
Translation of Office Action in Korean application 2008-7026775, corresponding to U.S. Appl. No. 11/730,361, citing KR100610929 Dated Aug. 30, 2010.
Andrisano, et al., On the Spectral Efficiency of CPM Systems over Real Channel in the Presence of Adjacent Channel and CoChannel Interference: A Comparison between Partial and Full Response Systems, IEEE Transactions on Vehicular Technology, vol. 39, No. 2, May 1990.
First Office Action issued from the Chinese Patent Office in connection with corresponding Chinese application No. 200380101286.2, Jan. 19, 2007.
Draft Corrigendum to IEEE Standard for Local and Metropolitan Area Networks—Part 16: Air Interface for Fixed Broadband Wireless Access Systems, IEEE P802.16-2004/Cor1/D5.
Draft IEEE Standard for Local and Metropolitan Area Networks—Part 16: Air Interface for Fixed and Mobile Broadband Wireless Access Systems; Amendment for Physical and Medium Access Control Layers for Combined Fixed and Mobile Operation in Licensed Bands, May 13, 2004.
First Report issued by IP Australia on Jul. 31, 2007 in connection with the corresponding Australian application No. 2003239577.
IEEE 802.16(e), Part 16: Air Interface for Fixed Broadband Wireless Access Systems, 2005, Sections 8.4.10.2.1; 8.4.10.3.2.
International Search Report and Written Opinion—PCT/US06/002899, International Search Authority—US, Apr. 6, 2007.
Kannangara, et al., "Analysis of an Adaptive Wideband Duplexer with Double-Loop Cancellation," IEEE Transactions on Vehicular Technology, vol. 56, No. 4, Jul. 2007, pp. 1971-1982.
Mexican Office communication dated Jul. 2, 2007 issued from Mexican Patent Office for application PA/a/2004/011588 with partial translation thereof.
Notification of the First Office Action from Chinese Patent Office dates Sep. 8, 2006 for the corresponding Chinese patent application No. 200380105267.7.
Office Action issued from the Mexican Patent Office dated Feb. 22, 2008 in connection with the corresponding Mexican Patent Application No. PA/a/2004/011588.
Office communication dated Jan. 12, 2007 issued from the European Patent Office for counterpart application No. 03734139.9-1246.
Office communication dated Oct. 19, 2006 issued from the Mexican Patent Office for counterpart application No. PA/a/2004/011588.
Official communication issued from the European Patent Office dated Aug. 7. 2007 for the corresponding European patent application No. 03759271.4-2412.
Official communication issued from the European Patent Office dated Dec. 19, 2006 for the corresponding European patent application No. 03759271.4-2412.
Second Office Action issued from the Chinese Patent Office on Jul. 20, 2007 in connection with corresponding Chinese application No. 200380101286.2.
Specifications for2.3 GHz Band Portable Internet Service—Physical & Medium Access Control Layer, TTAS.KO-06.0082/R1, Dec. 2005.
Third Office Action issued from the Patent Office of People's Republic of China dated Jan. 4, 2008 in corresponding Chinese Patent Application No. 200380101286.2.
Translation of Office Action issued by Chinese Patent Office on Oct. 19, 2007 in connection with the corresponding Chinese application No. 03814391.7.
U.S. PTO Office Action mailed on Apr. 17, 2007 for the corresponding parent patent U.S. Appl. No. 11/339.838, now U.S. Patent No. 7,230,935.
U.S. PTO Office Action mailed on Jan. 24, 2007 for the corresponding parent U.S. Appl. No. 11/339,838, now U.S. Patent No. 7,230,935.
U.S. PTO Office Action mailed on Nov. 21, 2006 for the corresponding parent U.S. Appl. No. 11/339,838, now U.S. Patent No. 7,230,935.

U.S. PTO Office Action mailed on Nov. 8, 2006 for the corresponding parent U.S. Appl. No. 11/339,838, now U.S. Patent No. 7,230,935.

Dohler, Mischa, et al., Distributed PHY-layer mesh networks, 14th IEEE Proceedings on Personal, Indoor and Mobile Radio Communications, 2003., The United States of America, IEEE, Sep. 7, 2003, vol. 3, pp. 2543 to 2547.

Fujii, et al., Ad-hoc Cognitive Radio Cooperated with MAC Layer, Institute of Electronics, Information and Communication Engineers (IEICE) Technical Report, Japan, Institute of Electronics, Information and Communication Engineers (IEICE), May 4, 2005, vol. 105 (36), pp. 59 to 66.

Zimmermann, et al., "On the performance of cooperative diversity protocols in practical wireless systems," IEEE 58th Vehicular Technology Conference, 2003, The United States of America, IEEE, Oct. 6, 2003, vol. 4, pp. 2212 to 2216.

* cited by examiner

PHYSICAL LAYER REPEATER WITH DISCRETE TIME FILTER FOR ALL-DIGITAL DETECTION AND DELAY GENERATION

CROSS REFERENCE TO RELATED APPLICATIONS

This application claims priority to U.S. provisional application Ser. No. 60/647,385, filed on Jan. 28, 2005 and entitled DISCRETE-TIME BANDPASS FILTER, the contents of which are incorporated herein by reference. This application is also a continuation-in-part of U.S. application Ser. No. 10/531,078, filed on Apr. 12, 2005 and entitled WIRELESS LOCAL AREA NETWORK REPEATER WITH AUTOMATIC GAIN CONTROL FOR EXTENDING NETWORK COVERAGE, which in turn claims priority from international application PCT/US03/29130, filed on Oct. 15, 2003 and entitled WIRELESS LOCAL AREA NETWORK REPEATER WITH AUTOMATIC GAIN CONTROL FOR EXTENDING NETWORK COVERAGE, which in turn claims priority from U.S. provisional application Ser. No. 60/418,288, filed on Oct. 15, 2002 and entitled AGC TECHNIQUES FOR WLAN REPEATER, the contents of these applications being incorporated herein by reference. In addition, this application is also a continuation-in-part of U.S. application Ser. No. 10/533,589, filed on May 3, 2005 and entitled WIRELESS LOCAL AREA NETWORK REPEATER WITH DETECTION, which in turn claims priority from international application PCT/US03/35050, filed on Nov. 17, 2003 and entitled WIRELESS LOCAL AREA NETWORK REPEATER WITH DETECTION, which in turn claims priority from U.S. provisional application Ser. No. 60/426,541, filed on Nov. 15, 2002 and entitled DETECTION TECHNIQUES FOR A WLAN REPEATER, the contents of these applications being incorporated herein by reference.

FIELD OF THE INVENTION

The present invention relates generally to wireless local area networks (WLANs) and, particularly, the present invention relates to a discrete time bandpass filter capable of being used, for example, in a WLAN repeater.

BACKGROUND OF THE INVENTION

WLAN repeaters operating on the same frequencies have unique constraints due to the above spontaneous transmission capabilities and therefore require a unique solution to problems arising from the use of the same frequencies. Since repeaters use the same frequency for receive and transmit channels, some form of isolation must exist between the receive and transmit channels of the repeater. While some related systems such as, for example, CDMA systems used in wireless telephony, achieve channel isolation using sophisticated techniques such as channel coding, directional antennas, physical separation of the receive and transmit antennas, or the like, such techniques are not practical for WLAN repeaters in many operating environments such as in the home where complicated hardware or lengthy cabling is not desirable or may be too costly.

Challenges in the development of a wireless repeater include delaying IF processing in connection with signal detection to allow time to reliably detect the incoming signal and perform transmitter setup for repeating operation. One system, described in International Application No. PCT/US03/16208 and commonly owned by the assignee of the present application, resolves many of the above identified problems by providing a repeater which isolates receive and transmit channels using a frequency detection and translation method. The WLAN repeater described therein allows two WLAN units to communicate by translating packets associated with one device at a first frequency channel to a second frequency channel used by a second device. In order to provide accurate repeating capability certain components such as bandpass filter elements, delay elements, and the like are used and are typically provided through the use of discrete components or subsystems, such as filter elements, delay line units, or the like. As production for such repeaters increases, so does the need to reduce costs by reducing part counts, form factor, and the like. Thus the corresponding need to decrease the costs of individual components increases making it desirable to replace certain discrete high cost components such as bandpass filters, delay lines and the like with more cost effective devices.

SUMMARY OF THE INVENTION

In accordance with various exemplary embodiments, RF in circuit propagation delays may be used to facilitate rapid detection by allowing analog storage of received waveforms while signal detection and transmitter configuration take place within digital sections. Signal detection may be performed prior to the expiration of RF delay periods, thereby providing additional time to perform the required configuration for the system. Further an all digital delay line can be used to facilitate the performance of detect and delay in parallel in an all digital implementation.

RF delays previously implemented using Surface Acoustic Wave (SAW) filters can be replaced with a discrete bandpass filter in accordance with various exemplary embodiments. While SAW filters provide the capability to enable analog signal storage, to provide channel selection, to provide jammer suppression, to provide a "feed-forward" variable gain control path, and the like, they can be expensive to implement. Thus the exemplary discrete bandpass filter can further be used to replace delay line elements which can also be expensive to implement particularly where SAW filters are used.

In the exemplary discrete-time bandpass filter sampling delay lines can be used to replace SAW based delay lines digital samples or analog samples can be processed depending on implementation constraints such as die size and the like. For example in applications where die sizes are limited, the components associated with generating and processing digital samples may be too large or expensive to implement. An alternative is to perform discrete-time sampling of analog waveforms avoiding conversion devices and other digital components.

A discrete-time analog bandpass filter can be configured to select a desired channel from undesired signals in an RF digital communications receiver. The discrete time analog bandbass filter can include a preliminary filter stage configured to provide a decimation and/or a delay of an input signal to provide a decimated input signal. An intermediate filter stage can be configured to provide bandpass filtering of the decimated input signal and a terminal filter stage configured to provide an interpolation and/or a delay of the filtered input signal.

In another embodiment, a discrete-time analog bandpass filter can shape a spectrum of a transmitted signal in an RF digital communications transmitter. The discrete time analog bandbasss filter for such shaping can also include a preliminary filter stage configured to provide a decimation and/or a delay of the transmitted signal to provide a decimated transmit signal. An intermediate filter stage can be configured to provide a bandpass filtering of the decimated transmit signal to provide a filtered transmit signal. A terminal filter stage can be configured to provide an interpolation and/or a delay of the filtered transmit signal.

A discrete-time analog bandpass filter has multiple filter stages including a preliminary filter stage, an intermediate filter stage, and a terminal filter stage, the discrete-time analog bandpass filter comprising at least a decimating filter, an interpolating filter, and a single-rate filter. A bandpass frequency range associated with the discrete time analog bandpass filter is translated between a first range and a second range by multiplication of a frequency associated with the decimating filter, the interpolating filter, and the single-rate filter by a periodic signal.

In accordance with various exemplary embodiments, a sampling rate associated with one or more of the preliminary filter stage, the intermediate filter stage, and the terminal filter stage is adjustable. Further, a center frequency associated with the one or more of the preliminary filter stage, the intermediate filter stage, and the terminal filter stage is adjustable. A pass bandwidth associated with the one or more of the preliminary filter stage, the intermediate filter stage, and the terminal filter stage is adjustable. A stop bandwidth associated with the one or more of the preliminary filter stage, the intermediate filter stage, and the terminal filter stage is adjustable. A stop band attenuation associated with the one or more of the preliminary filter stage, the intermediate filter stage, and the terminal filter stage is adjustable, where different stop band attenuations are included associated with different frequency ranges, for rejecting known signals. A group delay associated with the one or more of the preliminary filter stage, the intermediate filter stage, and the terminal filter stage is adjustable. The frequency response associated with the one or more of the preliminary filter stage, the intermediate filter stage, and the terminal filter stage is adaptive in such a way as to minimize an error signal constructed from an output of the one or more.

It is important to note that a discrete-time analog bandpass filter is configured to perform a discrete-time delay line function, and a discrete-time filter function performed in parallel with a detection function, such as where the discrete-time delay line function the discrete-time filter function are performed as a continuous amplitude sampled delay line function. The discrete time analog bandpass filter and in particular the discrete-time filter function is implemented using a sum of weighted currents derived from the sampled delay line and implemented using one or more of a resistor ratio, a variable resistive structure including a Field Effect Transistor. Alternatively, the discrete-time delay line function is implemented as a digitally sampled delay line having quantized samples and the detection function is performed using the quantized samples in parallel with the discrete-time filter function.

In other embodiments, the detection is performed by another circuit in parallel with the delay line and filter structure. The discrete time delay line function can also be performed using a discrete time sampled delay line to compensate for a delay of a signal detection circuit such that control action is performed prior to a detected signal being available at an output of the discrete time sampled delay line and samples generated from the discrete time sampled delay line are input to multiple filters included in a detector circuit such as a correlator or alternatively a power detector.

After detection and delay, the discrete-time sampled delay line and the multiple filter structure can include a variable gain amplifier, automatic gain control circuit including the variable gain amplifier, or the like. Further, the power detection circuit can generate a power detection output, and wherein the automatic gain control circuit including the variable gain amplifier. The power detection circuit can be configured to receive an input associated with the discrete-time sampled delay line or can be configured to receive an external input.

It will also be appreciated that in accordance with many embodiments, the exemplary discrete time analog bandpass filter can be located in a wireless communication system, network or the like and further can be implemented in a device such as wireless repeater, operating using, for example, a time division duplexed protocol.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention

DETAILED DESCRIPTION OF THE INVENTION

It will be appreciated that by way of general summary, the discrete time bandpass filter of the present invention can provide a discrete time delay line in either digital or analog to compensate for the delay in detection of a signal in a wireless repeater. The present invention can be used to minimize or eliminate clipping of re-transmitted signals from the wireless repeater which can operate using a TDD frequency translation scheme.

An exemplary delay line can be used to perform discrete time filtering such as FIR, IIR, multi-rate or the like, by inputting delay line output to multiple selectable filters, such as filters with selectable taps, correlation filters, power detection filters which can be used as inputs to the wireless repeater, or the like.

Output of the exemplary delay line can be used to control a variable gain adjustment affecting the output signal level from one/all of the filters or the delay line. It will be appreciated that a variable gain element in the discrete-time sampled delay line and multiple filters can constitute at least part of an automatic gain control unit or circuit.

Figure 1:
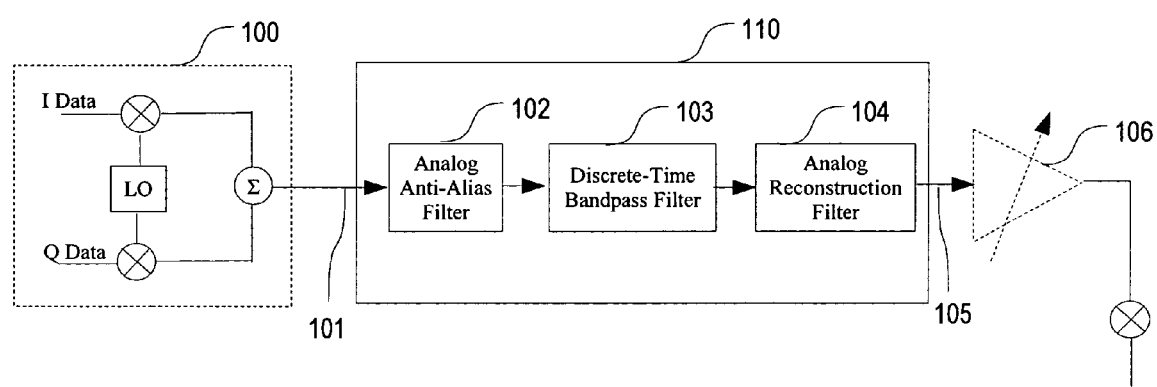
FIG. 1 is a diagram illustrating the placement of an exemplary discrete time bandpass filter in an Intermediate Frequency (IF) processing path in accordance with various exemplary embodiments.

In accordance with various embodiments, as shown in FIG. 1, an exemplary discrete-time analog bandpass filter 110 containing for example a discrete-time analog bandpass element 103 for use at intermediate frequencies (IF) in the range 400-600 MHz can be designed for operation using parameters as outlined hereinbelow. It should be noted that while described as a discrete time analog bandpass filter, the exemplary filter can also be implemented as an analog filter. The IF input signal 101 which can be generated in a manner typical in the art, such as from IF converter 100 including an In-phase (I) Data and Quadrature (Q) Data signal mixed with a Local Oscillator (LO). The IF input signal 101 can be processed in the anti aliasing filter 102, and be input into a first processing stage of the discrete-time analog bandpass filter element 103. The output of the discrete-time analog bandpass filter element 103 can be input to an analog reconstruction filter 104 and an IF output signal 105 can be generated. The IF output signal 105 can further be output to an Automatic Gain Controller (AGC) 106 for further processing as will be appreciated by one of ordinary skill in the art.

Filter characteristics used in accordance with various exemplary embodiments are shown in Table 1. It should be noted that the sampling aperture jitter is based on 1 degree of jitter at 600 MHz. Accordingly, the exemplary filter is centered at the upper end of the IF range, so that the more challenging aspects of implementation can be addressed.

TABLE 1

Sample Filter Characteristics.

| Characteristic | Value |
| --- | --- |
| Center frequency | 600 MHz |
| Pass bandwidth | >18 MHz |
| Passband ripple | <0.25 dB |
| Stop bandwidth | <26 MHz |
| Stop band attenuation | >50 dB |
| Group delay | >300 ns |
| Sampling aperture jitter | <4.6 ps |

Since the exemplary filter uses sampled data, aliased pass bands are responded to at the input, and alias pass band images are generated at the output. Therefore, as noted and as illustrated in FIG. 1, the analog anti-alias filter 102 such as a lowpass filter must be inserted at the input to the discrete-time analog bandpass filter element 103, and the analog reconstruction filter 104 must be inserted at the output of the discrete-time analog bandpass filter element 103.

The exemplary filter is implemented as a discrete-time, continuous-amplitude filter, so that ADCs and DACs are not used. Feasibility of an exemplary discrete time filter in accordance with various exemplary embodiments can preferably be evaluated separately for each of the filter stages to be described hereinafter. It will be appreciated that simplified, but still useful filter configurations can be obtained by using some, but not all, of the stages. It may further be possible to reduce the number of taps in some stages, so that the tap counts shown should be taken as starting points, for example for illustrative purposes.

In order to properly evaluate feasibility of the exemplary discrete time filter in accordance with a particular application, the following issues merit consideration and can include for example, sampling rate, number of taps, filter coefficient ratio tolerance, maximum feasible tap attenuation, parasitic leakage paths (especially reactive), voltage droop noting that tap coefficients could be adjusted to partially compensate for predictable droop, clock jitter, aperture jitter, phase noise, signal integrity, including linearity, harmonic distortion, intermodulation, thermal noise, switching noise, dynamic range, stage-to-stage isolation, crosstalk, filter-to-filter isolation where 2 or more filters reside on the same chip. In addition to the above noted issues, specific issues related to the use of ASIC technology should be considered including fabrication process such as RF CMOS, SiGe BiCMOS, and the like, and fabrication geometry such as die size, power consumption.

Figure 2:
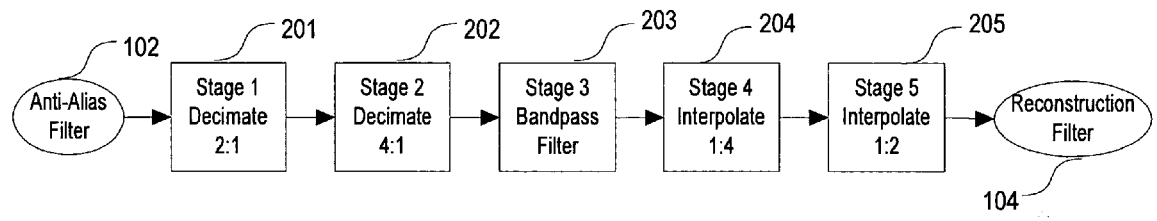
FIG. 2 is a diagram illustrating various stages of an exemplary discrete time bandpass filter in an Intermediate Frequency (IF) processing path in accordance with various exemplary embodiments.

In accordance with various exemplary embodiments, the filter design can include five stages, as shown in FIG. 2. Thus the output of the analog anti-alias filter 102 can be input to a Stage 1 201 of the discrete-time analog bandpass filter element 103. The Stage 1 201 is a 2:1 decimator and can be followed by a Stage 2 202 which is a 4:1 decimator. Both the Stage 1 201 and the Stage 2 202 use a polyphase implementation. A Stage 4 204 and a Stage 5 205 can use the same filter coefficients as the Stage 1 201 and the Stage 2 202, but are configured as polyphase interpolators. A Stage 3 303 can be a steep-skirted bandpass filter, which is run at one-eighth of the input or output sampling rate of the discrete-time analog bandpass filter element 103.

Input and output sampling rates for each stage are shown in Table 2, both for the 600 MHz IF used in the sample design, and for the general case. With these sampling rates, the lowest-frequency alias is centered at 2143 MHz. Thus, the anti-alias and reconstruction filters must have sufficient attenuation at 2143 MHz to achieve the desired distortion level.

An exemplary group delay for each stage in the discrete time analog bandpass filter is shown in Table 3. The total group delay is close to 500 ns.

TABLE 2

Filter Stage Sampling Rates.

| | Sampling Rates (MHz) for 600 MHz IF | | Sampling Rates (MHz) for $f_C$ MHz IF | |
| --- | --- | --- | --- | --- |
| Stage | Input | Output | Input | Output |
| 1 | 2743.000 | 1371.500 | $(32/7)*f_C$ | $(16/7)*f_C$ |
| 2 | 1371.500 | 342.875 | $(16/7)*f_C$ | $(4/7)*f_C$ |
| 3 | 342.875 | 342.875 | $(4/7)*f_C$ | $(4/7)*fC$ |
| 4 | 342.875 | 1371.500 | $(4/7)*f_C$ | $(16/7)*f_C$ |
| 5 | 1371.500 | 2743.000 | $(16/7)*f_C$ | $(32/7)*f_C$ |

TABLE 3

Filter Group Delay, by Stage.

| Stage | Group Delay (ns) |
|---|---|
| 1 | 16 |
| 2 | 17 |
| 3 | 429 |
| 4 | 17 |
| 5 | 16 |
| Total | 495 |

Figure 3:
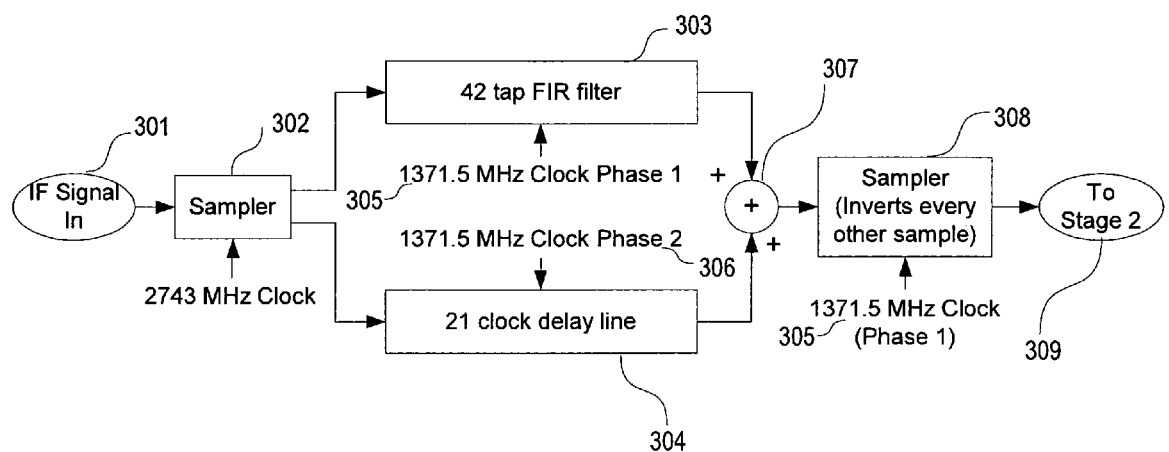
FIG. 3 is a diagram illustrating an exemplary stage 1 of the discrete time bandpass filter in accordance with various exemplary embodiments.

A diagram for exemplary components associated with the Stage 1 201 of discrete-time analog bandpass filter element 103 is shown in FIG. 3. The Stage 1 201 can include an input sampler 302, such as an input sample-and-hold stage, which can receive an input from IF signal input 301. The Stage 1, 201 further includes two delay lines such as a 42 tap Finite Impulse Response (FIR) filter 303 and a 21 clock cycle delay line 304, and a summer 307, and an output sampler such as an inversion sampler 308 configured, for example, to invert every other sample output from the summer 307. The 42 tap FIR filter 303 can be clocked with a 1371.5 MHz Phase 1 clock 305 and is configured as a finite impulse response (FIR), transversal filter, or the like, which can function as a delay line. The 21 clock cycle delay line 304 can be clocked with a 1371.5 MHz Phase 2 clock 306 and is configured as a simple delay line. The output of the 42 tap FIR filter 303 and the 21 clock cycle delay line 304 are added in the summer 307, which is updated at half the input sampling frequency in inversion sampler 308.

It should be noted that the continuous-time analog input signal can be sampled at 2743 MHz using for example, a fast sample-and-hold circuit or the like as will be appreciated by one of ordinary skill in the art. Two half-frequency clock phases at 1371.5 MHz and 180 degrees out of phase from each other, such as the 1371.5 MHz Phase 1 clock 305 and the 1371.5 MHz Phase 2 clock 306, are generated from the 2743 MHz clock. The 1371.5 MHz Phase 1 clock 305 and the 1371.5 MHz Phase 2 clock 306 can be used to clock the "odd" beat samples into the 42 tap FIR filter 303 and the "even" beat samples into the 21 clock cycle delay line 304. The outputs of the 42 tap FIR filter 303 and the 21 clock cycle delay line 304 are summed as noted above in summer 307 and re-sampled in inversion sampler 308 at an output sampling rate associated with the 1371.5 MHz Phase 1 clock 305.

The inversion sampler 308, which, as noted, uses the 1371.5 MHz Phase 1 clock 305, inverts the polarity of every other sample. The alternate sample polarity inversion effectively multiplies the output signal by a 685.75 MHz sampled sine wave yielding a single mixing product at 85.75 MHz, which serves as an internal "second IF." It will be appreciated that the Stage 3 203 bandpass filter element can be centered at 85.75 MHz. The output of the inversion sampler 308 can be input to Stage 2 at 309. Tap coefficients for the 42 tap FIR filter 303 are symmetrically equal. Accordingly coefficients 1 and 42 are equal, coefficients 2 and 41 are equal, coefficients 3 and 40 are equal, and so on. Tap coefficients may either be positive, such as non-inverting or negative such as inverting. The taps with the smallest ratios such as taps located at the filter's ends can have the value of, for example, 0.000270 which corresponds to an attenuation of 71.4 dB.

Figure 4:
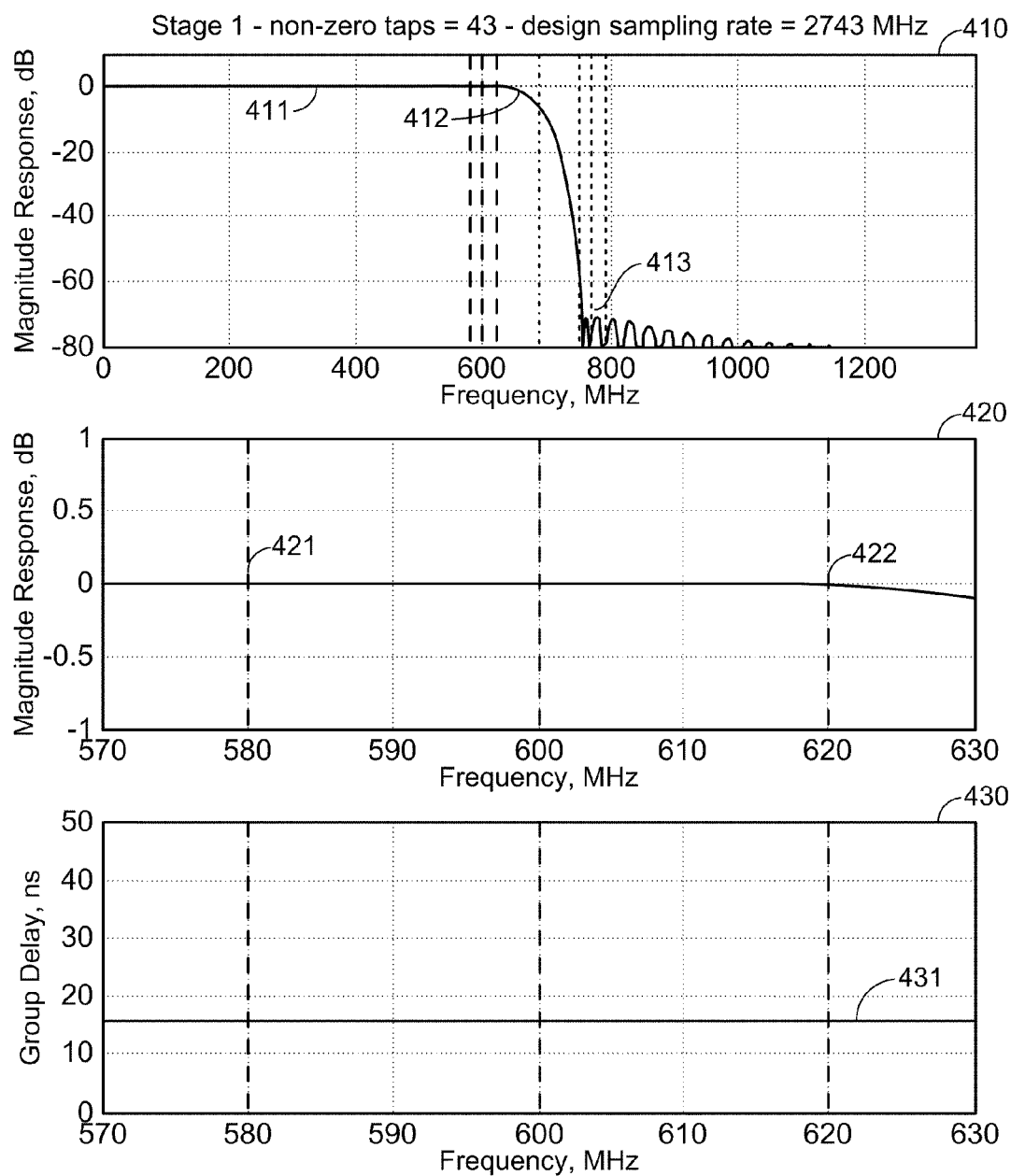
FIG. 4 is a graph illustrating exemplary responses of stage 1 of FIG. 3, in accordance with various exemplary embodiments.

The Stage 1 201 filter element frequency response 410 and 420 and a group delay curve 430 are shown in FIG. 4. In the wide scale frequency response graph 410, trace 411 shows the response from around 0 to around 1200 MHz. The vertical dashed lines in the vicinity of 412 show the approximate location of the 40 MHz wide passband; and the vertical dashed lines in the vicinity of 413 show the corresponding image. The narrow scale frequency response graph 420 shows a portion of the pass band such as from 421 to 422. The group delay graph 430 shows trace 431 which indicates a relatively constant group delay at approximately 15 ns across the frequency spectrum from around 570 MHz to around 630 MHz. It should be noted that the graphs 410, 420, and 430 do not reflect the inversion of alternate samples at the Stage 1 output sampler.

Figure 5:
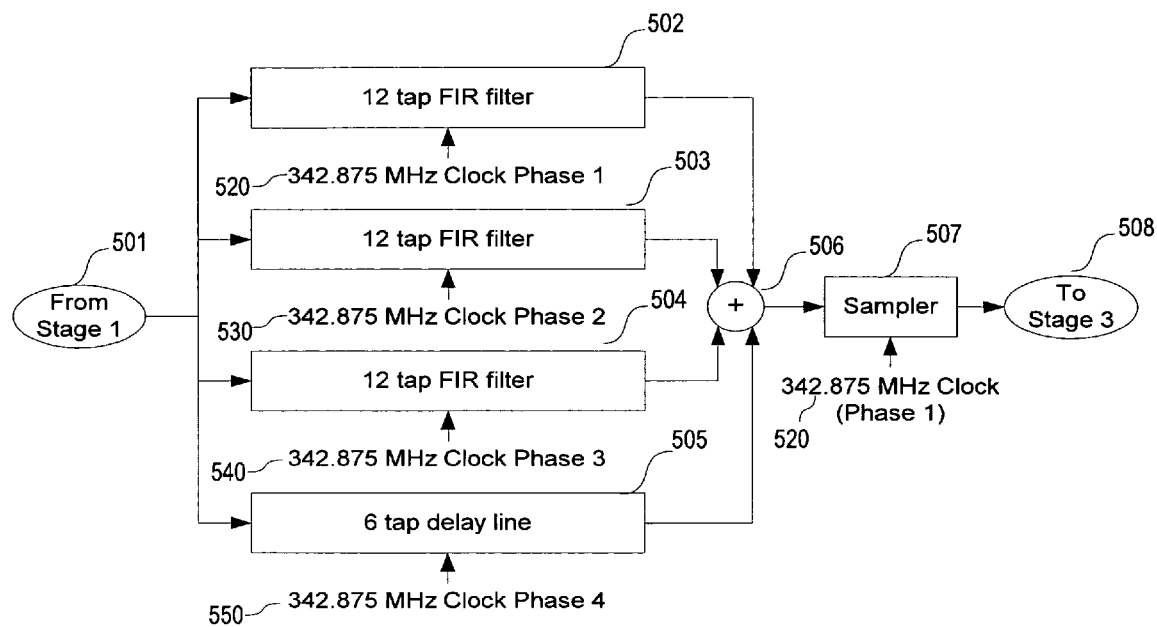
FIG. 5 is a diagram illustrating an exemplary stage 2 of the discrete time bandpass filter in accordance with various exemplary embodiments.

In accordance with various exemplary embodiments, a diagram for Stage 2 202, which can be used to implement a decimate-by-4 polyphase filter, is shown in FIG. 5. The Stage 2 202 can include three 12-tap FIR filters 502, 503, and 504 having three different coefficient sets respectively. The Stage 2 202 can further include a 6 tap delay line 505, an output summing node 506, and an output sampler 507. It should be noted that in the Stage 2 202, there is no alternate sample polarity inversion in the output sampler. Input samples arrive from the Stage 1 201 at 501 at a 1371.5 MHz rate. Four 342.875 MHz clock phases 520, 530, 540, and 550, shifted at 90 degree intervals, are generated from the basic 1371.5 MHz clock. The four phases 520, 530, 540, and 550 are used to clock every fourth sample into a given branch in, for example, a round robin order such as from top to bottom and so on. While, as noted filter coefficients are different for the three 12-tap FIR filters 502, 503, and 504, the smallest filter coefficient is, for example, 0.000632, which corresponds to an attenuation of 64.0 dB. The output of the three 12-tap FIR filters 502, 503, and 504, and the 6 tap delay line 505 can be output and combined in a summer 506, and sampled in a sampler 507 at 342.875 MHz clock Phase 1 520 for output to Stage 3 203 at 508.

Figure 6:
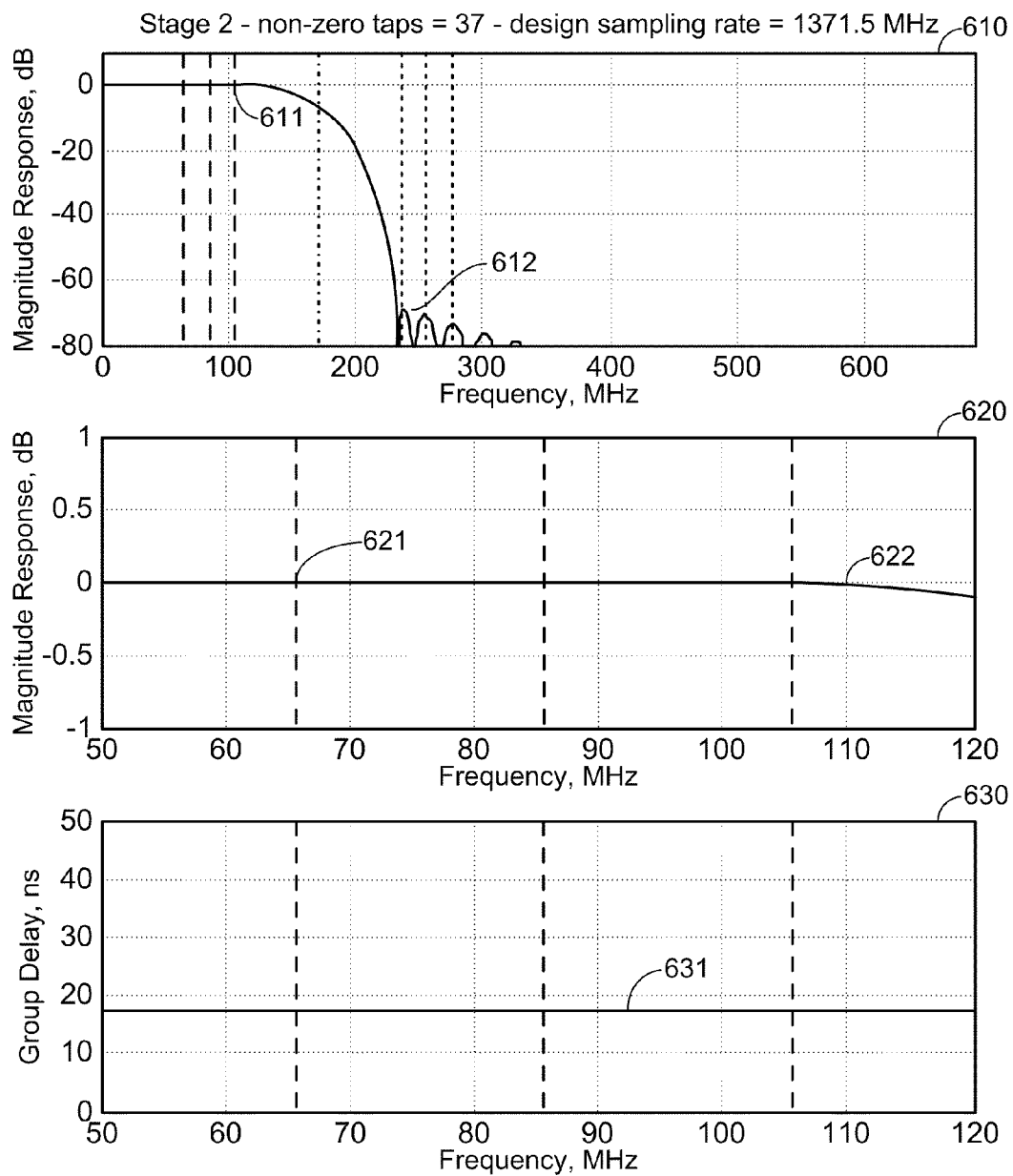
FIG. 6 is a graph illustrating exemplary responses of stage 2 of FIG. 5, in accordance with various exemplary embodiments.
Figure 7:
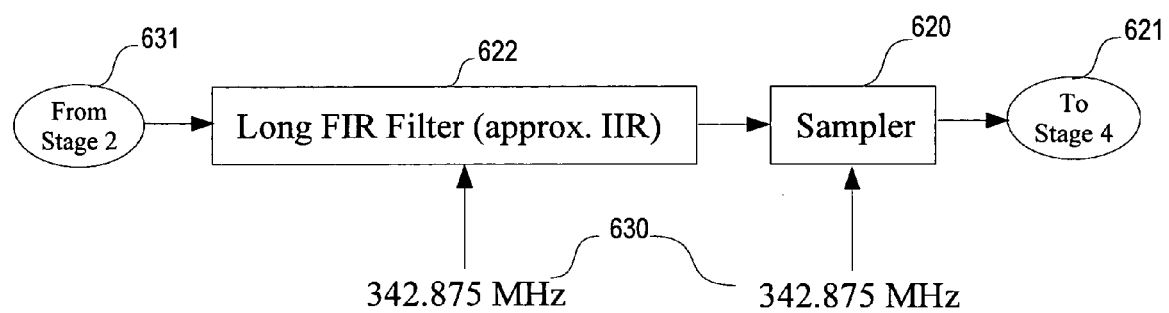
FIG. 7 is a diagram illustrating an exemplary stage 3 of the discrete time bandpass filter in accordance with various exemplary embodiments.

It will be appreciated that the frequency response and group delay for the Stage 2 202 is shown in FIG. 6. In wide scale frequency response graph 610 the vertical dashed lines in the vicinity of 611 and in the vicinity of 612 demarcate a 40 MHz passband, with the vertical dashed lines in the vicinity of 612 showing the image with the lowest frequency. In the narrow scale frequency response graph 620 the passband region is noted with greater resolution, for example, between around 621 and around 622. The group delay graph 630 is shown where trace 631 is relatively flat at around 18 ns across the passband.

The Stage 3 203 filter element can be a long FIR filter 622 operating at a sampling rate of 342.875 MHz 630. It will be appreciated that by using the term "long" in connection with the FIR filter 622, an approximation of an Infinite Impulse Response filter is intended. Such filters can use a large number of taps or can be designed in a manner to approximate an IIR response as will be appreciated. The response of the FIR filter 622 is symmetric with respect to an 85.71875 MHz center frequency, which is exactly one quarter of the sampling rate. Note that the filter's center frequency (85.71875 MHz) is slightly different from the "second IF" (85.875 MHz). The difference occurs because the input sampling rate is rounded to 2743 MHz, from its target design value of 2742.857 MHz= (32/7)*600 MHz. The resulting difference is not significant for the application described herein. The specific choice of center frequency yields a stage 3 design in which around half of the coefficients are zero. The FIR filter 622 has an order of 294, such as 0 to 294 coefficients or 295 total coefficients. Of the 295 coefficients, only 147 have non-zero values. The smallest coefficient has the value of, for example, 0.000108775 relative to the value of the center tap, which requires an attenuation of 79.3 dB. It will further be appreciated that samples generated from a sampler 620 can be output to the Stage 4 204 at 621.

Figure 8:
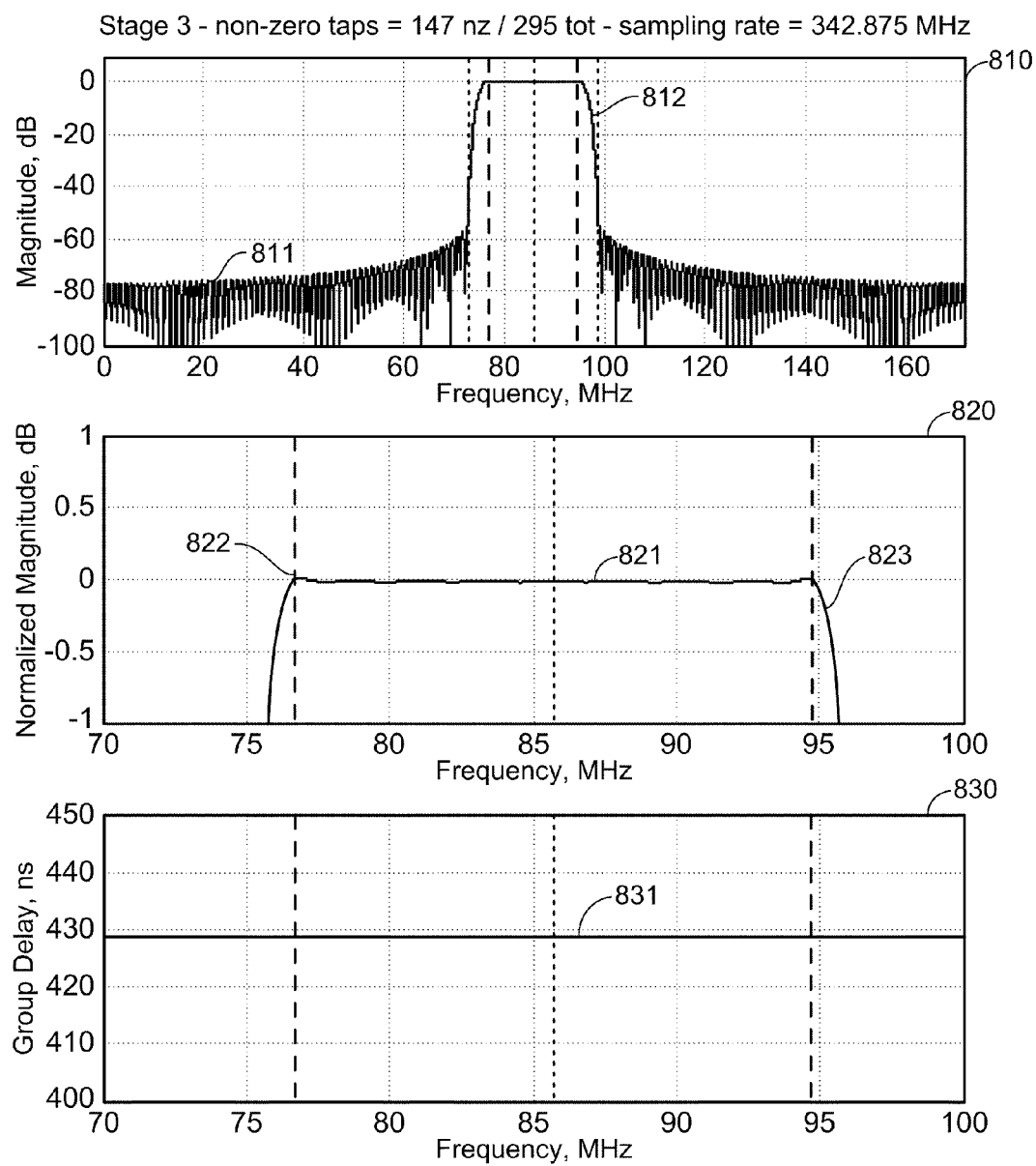
FIG. 8 is a graph illustrating exemplary responses of stage 3 of FIG. 7, in accordance with various exemplary embodiments.

The frequency response and group delay for the Stage 3 203 is shown in FIG. 8. In wide scale frequency response graph 810 the vertical dashed lines in the vicinity of 812 demarcate an approximate 20 MHz passband centered at 85.71875 MHz as noted above, section 811 shows the low frequency stop band with a corresponding high frequency stop band to the right of passband section 812. In the narrow scale frequency response graph 820 the passband region is noted with greater resolution, for example, between around 822 and around 823 centered, as noted at 821 and around 85.71875 MHz. The group delay graph 830 is shown where trace 831 is relatively flat at around 428 ns across the passband.

Figure 9:
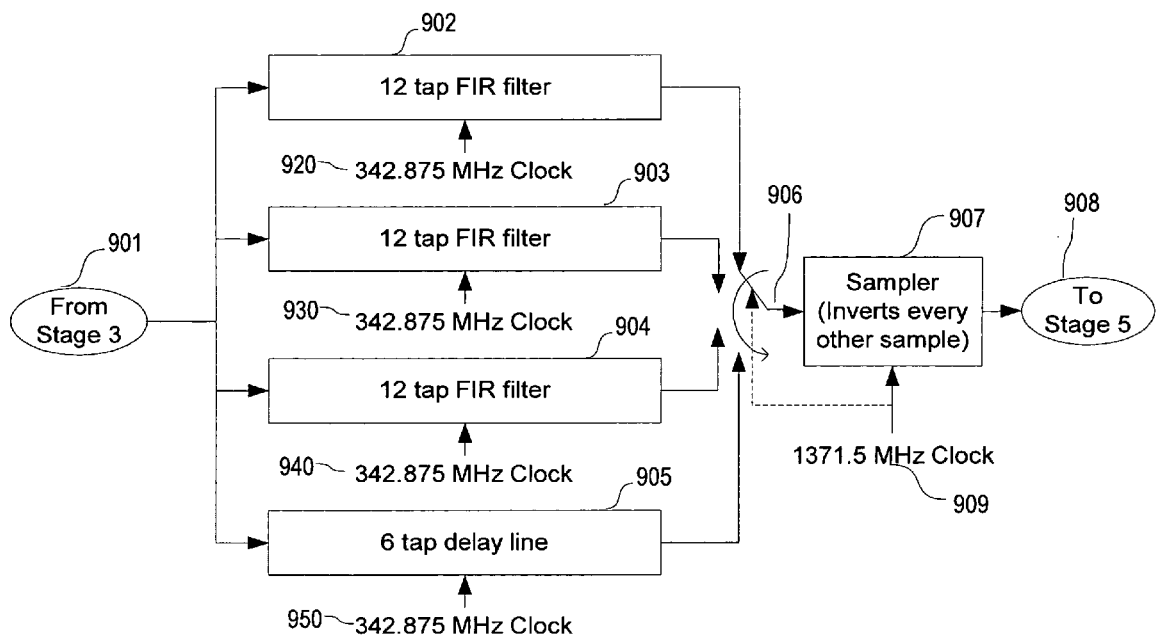
FIG. 9 is a diagram illustrating an exemplary stage 4 of the discrete time bandpass filter in accordance with various exemplary embodiments.
Figure 10:
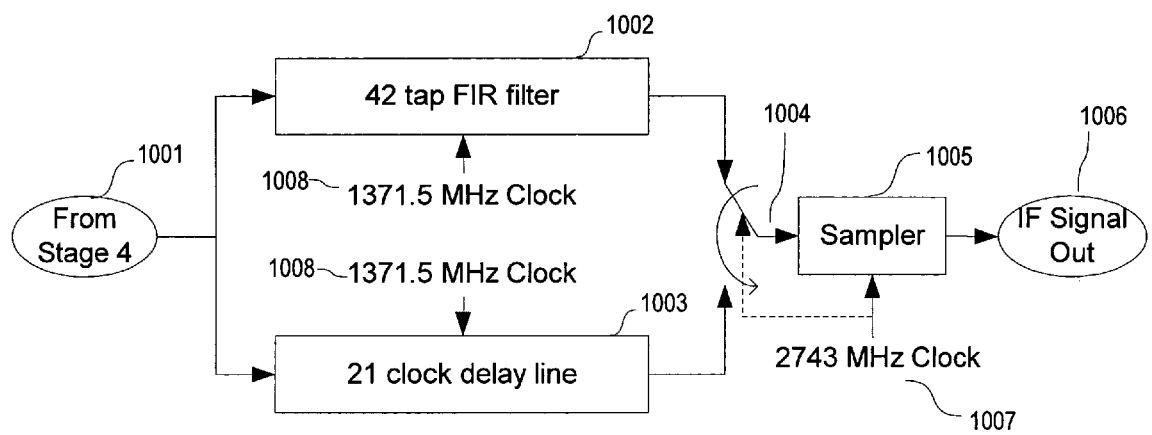
FIG. 10 is a diagram illustrating an exemplary stage 5 of the discrete time bandpass filter in accordance with various exemplary embodiments.

The Stage 4 204 is a 1:4 polyphase interpolator using three 12-tap FIR filters 902, 903, and 904 having three different coefficient sets respectively and a 6 tap delay line 905 in the manner described, for example, in connection with FIG. 5, arranged as in FIG. 9. Samples are received from Stage 3 at 901 a 342.875 MHz sampling rate. Each input sample is clocked into each of the four branches associated with the three 12-tap FIR filters 902, 903, 904, and the 6 tap delay line 905, which are updated at the same time. At the output of the three 12-tap FIR filters 902, 903, 904, and the 6 tap delay line 905, the equivalent of a single pole, quadruple throw (1P4T) rotary switch 906 steps through positions at a 1371.5 MHz rate 909, sampling each of the four branch values before updating in an inversion sampler 907 which is configured to invert the polarity of every other sample converting the 85.875 MHz "second IF" back to 600 MHz for output to the Stage 5 205 at 908.

It will be appreciated that the frequency response and group delay for the Stage 4 204, for example, as referenced to the output sampling rate, is the same as that for Stage 2 as show, for example, in FIG. 6.

The Stage 5 205 is a 1:2 polyphase interpolator using components such as a 42 tap Finite Impulse Response (FIR) filter 1002 and a 21 clock cycle delay line 1003 as described above, for example, in connection with the Stage 1 201. At 1001, the output from the Stage 4, 204 can be input to the 42 tap Finite Impulse Response (FIR) filter 1002 and the 21 clock cycle delay line 1003 for processing in accordance with a 1371.5 MHz clock 1008. The output of the 42 tap Finite Impulse Response (FIR) filter 1002 and the 21 clock cycle delay line 1003 can be sampled by the equivalent of a rotary switch 1004 which can be input to sampler 1005. The output at 1006 is the IF signal output which can be gain controlled or the like as noted above.

Figure 11:
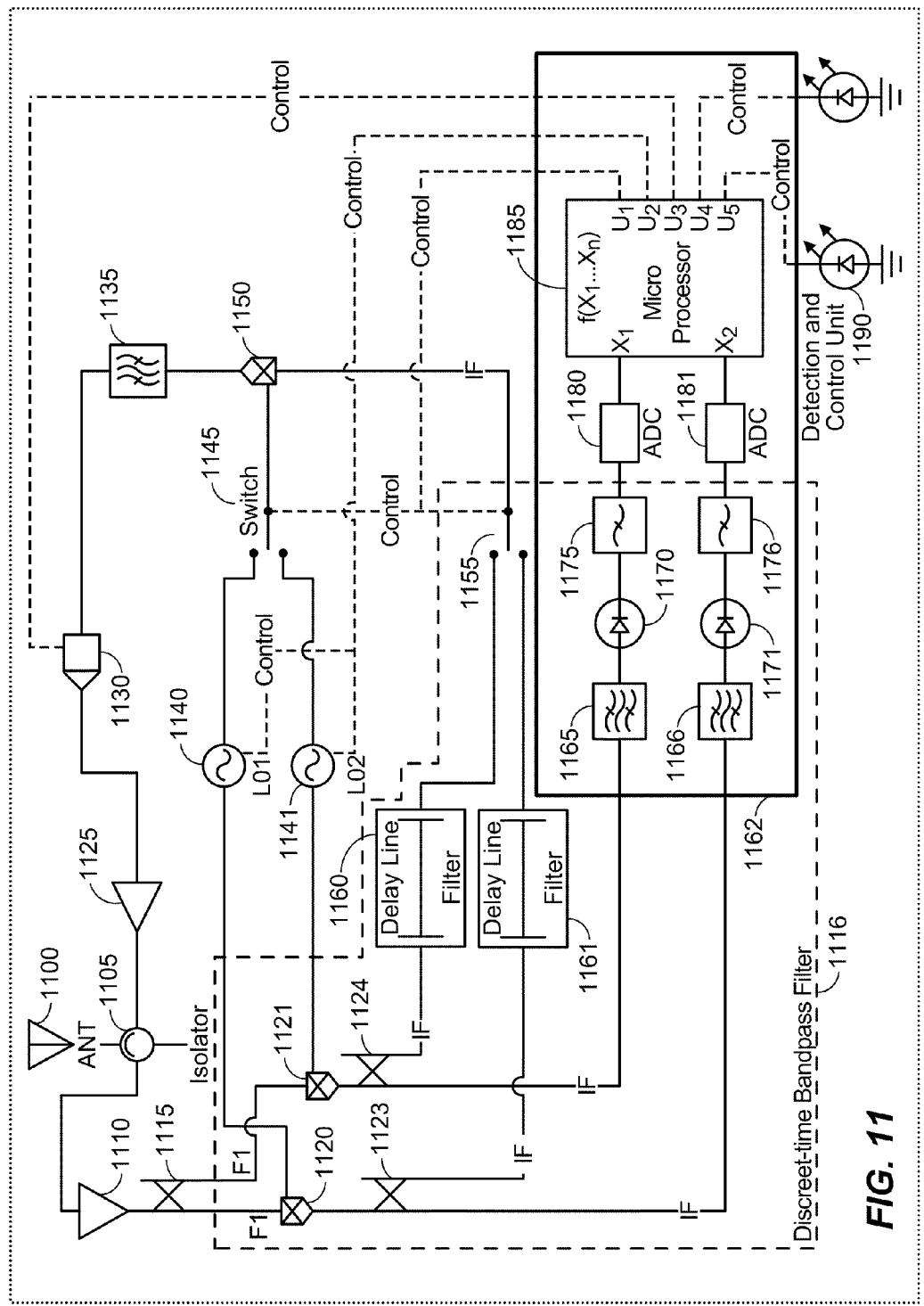
FIG. 11 is a diagram illustrating components capable of being replaced with an exemplary discrete-time bandpass unit in accordance with various exemplary embodiments.

It will be appreciated that in accordance with various exemplary embodiments, the present invention can be used to replace components which may be expensive or redundant in certain wireless repeaters. For example, a more common approach to performing repeating in accordance with various exemplary embodiments, is shown for example in FIG. 11. The antenna 1100 transforms received radio waves to a voltage signal and feeds the voltage signal to an isolator 1105. Alternatively, the isolator may not be included depending upon the type of different antenna configurations used. Two of these embodiments including such antenna configurations will be described below. The isolator 1105 allows a signal to pass from the antenna 1100 to a Low Noise Amplifier (LNA) 1110 and from a power amplifier 1125 to the antenna 1100, but blocks or isolates the LNA 1110 from the power amplifier 1125. Other embodiments of the isolator 1105 could include, but are not limited to, circulators, directional couplers, splitters, and switches. For instance, switches may be used with the dual directional antenna configuration. A signal received and transformed by the antenna 1100 passing through the isolator 1105 is fed to the LNA 1110, which amplifies the signal and sets the noise level at that point. A signal amplified by the LNA 1110 is fed to an RF splitter 1115, which performs an RF power splitting, or coupling, function on the signal to split the signal into two different paths for frequency F1 and F2 for example. The splitter 1115 could also be a directional coupler or any device that can separate one signal into two signals.

At this point, one skilled in the art will readily recognize that the antenna 1100, the LNA 1110 and the RF splitter 1115 are the primary components forming a receiver in an exemplary repeater. Further, one skilled in the art will readily recognize that the antenna 1100, the power amplifier 1125, the amplifier 1130, the filter 1135, the switch 1145 and the mixer 1150 are the primary components forming a transmitter in an exemplary repeater. In an alternative embodiment, the antenna 1100 and isolator 1105 could be replaced with dual antennas isolated by directivity or polarization, or other techniques known to those skilled in the art. Such dual antennas could be connected to the LNA 1110 and the power amplifier 1125.

The output of the splitter 1115 can be input to an exemplary discrete-time bandpass filter unit 1116 as described herein wherein mixers 1120, 1121 can act as frequency conversion devices that mix signals passed from the splitter 1115 with signals output from the local oscillators 1140, 1141 at respective frequencies designated as LO1, LO2 to produce intermediate frequency (IF) or typically lower frequency signals. It will be appreciated that the local oscillators 1140, 1141 are tuned to the different frequencies LO1, LO2 such that two different signals at two different frequencies fed from the splitter 1115 can be converted to a common IF frequency. It will be appreciated that the mixers 1120 and 1121 can be integrated into the discrete-time bandpass filter 1116 or can be used externally to feed splitters 1123 and 1123 which are integrated into the discrete-time bandpass filter 1116.

The splitters 1123, 1124, which operate the same as the splitter 1115 described above, separate the IF signals output from the respective mixers 1120, 1121 into two different paths. One path from each of the splitters 1123, 1124 goes to delay lines or delay line filters 1160, 1161, respectively, while the other path from each of the splitters 1123, 1124 goes to detection filters 1165, 1166, respectively. In accordance with various exemplary embodiments delay line filters 1160, 1161 and detection filters 1165, 1166 can be integrated into the discrete time bandpass filter unit 1116.

The delay line filters 1160, 1161, or the equivalent functions carried out using the discrete-time bandpass filter unit 1116, which are preferably band pass filters with delays, remove all outputs from the mixing operation except the desired frequency components. Preferably, the delay line filters 1160, 1161 have a sufficient time delay such that the detection and control unit 1162 can detect which of the two RF frequencies is present and perform control functions described below prior to the signals being available at the output of the delay line filters 1160, 1161, as detectors 1170, 1171 are in parallel with the delay line filters 1160, 1161 within the discrete-time bandpass filter unit 1116. It should be noted that if it is acceptable to truncate a portion of the first part of the RF signal, then the delay line filters 1160, 1161 would not need specified delays.

One skilled in the art will readily recognize that the mixers 1120, 1121, the splitters 1123, 1124 and the delay line filters 1160, 1161 are the primary components forming a frequency converter in the exemplary repeater. The detection filters 1165, 1166 in the detection and control unit 1162 also perform the same type of band pass filtering as the delay line filters 1160, 1161, and thus can be integrated into the discrete-time bandpass filter unit 1116. The main difference is that the detection filters 1165, 1166 are preferably fast filters without specified long time delays. Additionally, the detection filters 1165, 1166 preferably do not require the same level of filtering performance as the delay line filters 1160, 1161, although one skilled in the art would recognize that varying filter performance within the confines of performing the filtering objective can be a design choice notwithstanding the challenges of incorporating the respective functions into the discrete-time bandpass filter element 1116 in accordance with various exemplary embodiments. One skilled in the art would also recognize that filters or devices other than band pass filters might be used to perform the above discussed band pass functions.

Power detectors 1170, 1171 are simple power detection devices that detect if a signal is present on either of the respective frequencies F1, F2 and provide a proportional voltage output if the signal is present. Many types of analog detectors that perform this function may be used and can either be integrated or can be external devices. For example, such detectors could include, but are not limited to, diode detectors. Such diode detection could be performed at RF, IF or base band. Detectors providing higher performance than simple power detectors may also be used. These detectors may be implemented as matched filters at RF or IF using SAW devices, and matched filtering or correlation at base band after analog to digital conversion. The power detectors 1170, 1171 are used to determine the presence of a wireless transmission on one of the two IF channels by comparing signals on the two IF channels with a threshold. Such a threshold could be predetermined or calculated using for example, a portion of the discrete-time bandpass filter element 1116 based on monitoring the channels over time to establish a noise floor.

Further, the power detectors 1170, 1171 may be used to determine start and stop times of a detected transmission. The proportional voltage output by one of the power detectors 1170, 1171 in response to signal detection will be used by the microprocessor 1185 to control the retransmission of the signal. One of ordinary skill in the art will recognize that the power detection can be placed earlier or later in the signal processing path, as it is possible to detect signals so that the retransmission process may be switched on or off. Further, one of ordinary skill in the art will recognize that techniques for determining or limiting transmission time can be employed, including but not limited to placing a time limit on retransmission using a timer.

The filters 1175, 1176 are low pass filters and preferably have narrower bandwidths than the detection filters 1165, 1166. The filters 1175, 1176 are required to remove the high frequency components that remain after signal detection in the power detectors 1170, 1171 and to provide an increase in signal to noise ratio by providing processing gain by reducing the detection signal bandwidth. The signals output from low pass filters 1175, 1176 are input to conventional analog to digital converters 1180, 1181. It will further be appreciated that while analog to digital converters 1180 and 1181 are shown as being outside the discrete-time bandpass filter unit 1116. In a digital implementation it will be appreciated that digital to analog converters may be used in place of analog to digital converters 1180 and 1181 and a set of analog to digital converters can be used, for example, at the output of the splitters 1123 and 1124, inside the discrete-time bandpass filter unit 1116, although, as noted, such a configuration can lead to additional expense.

After the analog to digital converters 1180, 1181 convert the analog signal representing the detected power of the radio frequency RF signals power envelopes to digital signals in a manner well known to those skilled in the art, the resulting digital signals are sent to the microprocessor 1185. The microprocessor 1185, which can also be described as a logic state machine, digital signal processor, or other digital processing and control device, can be programmed to implement all necessary control algorithms to, with a high probability of certainty, detect the presence of either F1 or F2 and initiate appropriate control functions.

Alternatively, it should be noted that comparator detectors (not shown) with adjustable threshold controls may be used in place of the analog to digital converters 1180, 1181 and the microprocessor 1185 particularly in an analog implementation of the discrete-time bandpass filter unit 1116. Further, the control outputs of the microprocessor 1185 could be alternatively connected directly to digital gates to control the switching where input to these gates is taken directly from the comparator detector outputs. Further input to the digital logic may come from the microprocessor 1185 to allow for override control to the settings provided from the comparator detector's output. In this case the microprocessor 1185 would continue to control the detection and display functions, but; however, it is likely the control of the variable gain amplifier 1130 would be controlled directly from the power detectors 1170, 1171 using analog signals. Logarithmic amplifiers (not shown) can work off the envelope of the low pass filters can control the functions of an exemplary automatic gain control.

Feedback to a user can be controlled by the microprocessor 1185 via an indicator 1190 which could be, but is not limited to, a series of light emitting diodes. Feedback to the user could be an indication that the wireless repeater 200 is in an acceptable location such that either or both frequencies from the wireless access point 100 and the client device 105 can be detected, or that power is supplied to the wireless repeater 200.

Once either of the frequencies F1, F2 is detected, the microprocessor 1185 controls switches 1145, 1155. The switch 1155 is switched to allow the detected signal, either on F1 or F2, which is at an IF frequency, to be routed to the input of a frequency converter 1150, which is another frequency translation device similar to the mixers 1120, 1121. Additionally, the microprocessor 1185 will set the switch 1145 to allow a signal from the appropriate one of the local oscillators 1140, 1141 to be routed to the mixer 1150 so that the IF frequency at the input to the frequency converter 1150 is translated to the proper frequency at the output thereof.

Figure 12:
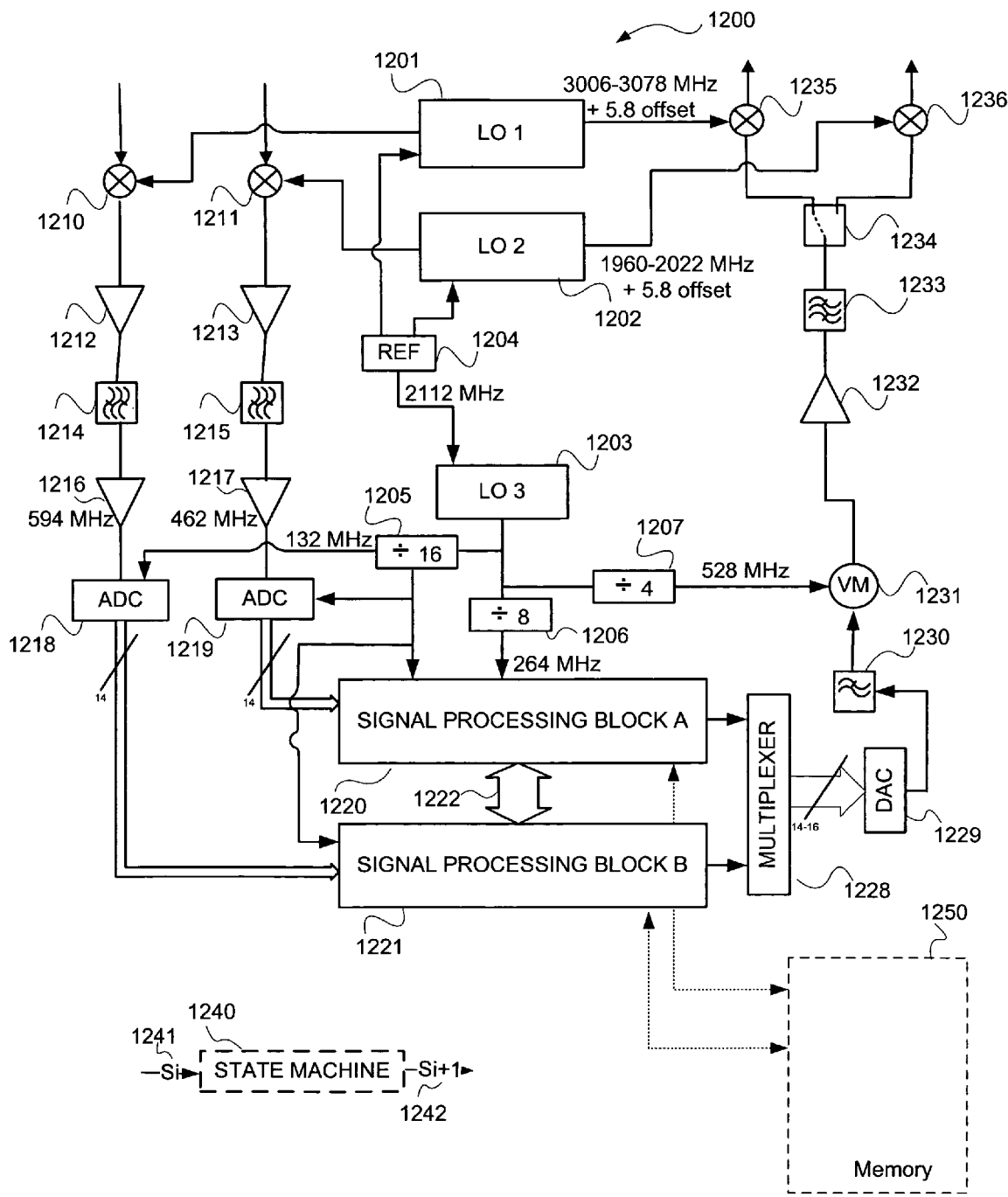
FIG. 12 is a circuit diagram illustrating various hardware components associated with an exemplary repeater configuration.

With reference to FIG. 12, a physical layer repeater circuit 1200 is shown for receiving on two frequency channels. A local oscillator LO 1 1201 can be used to drive one set of receive and transmit channels for down-conversion and up-conversion through an input mixer 1210 on the receive side and an output mixer 1235 on the transmit side. For down-conversion, the input mixer 1210 mixes a signal received from, for example, an antenna and inputs the mixed signal to amplifier 1212 as will be appreciated. The output of amplifier 1212 passes through a bandpass filter element 1214 the output of which is transferred to amplifier 1216 at intermediate frequency of, for example, 594 MHz. The output of the IF stage amplifier 1216 is transferred to analog-to-digital converter (ADC) 1218 which is preferably a 14 bit converter. The other set of receive and transmit channels are coupled to LO 2 1202, which is used for down down-conversion and up-conversion through an input mixer 1211 on the receive side and an output mixer 1236 on the transmit side. For down-conversion, the input mixer 1211 mixes a signal received from, for example, an antenna and inputs the mixed signal to amplifier 1213 as will be appreciated. The output of amplifier 1213 passes through a bandpass filter element 1215 the output of which is transferred to amplifier 1217 at intermediate frequency of, for example, 462 MHz. The output of the IF stage amplifier 1217 is transferred to ADC converter 1219 which is also preferably a 14 bit converter. It should be noted that the ADC converters 1218 and 1219 are driven, for example, at 132 MHz sampling by a clock generated from divider 1205, which is coupled to an LO 3 1203. The LO 1 1201, the LO 2 1202 and the LO 3 1203 are all coupled to a reference source 1204 which generates, for example, a 2112 MHz clock reference. In such a way, all the processing elements will be synchronized to a common clock reference for more accurate processing.

In order to perform additional baseband digital processing of the received signals, the outputs of the ADC 1218 and the ADC 1219 are coupled to dedicated signal processing blocks such as a signal processing block A (SPBA) 1220 and a signal processing block B (SPBB) 1221. The SPBA 1220 and the SPBB 1221 are coupled with a signal processing bus 1222. Optionally, a state machine 1240 can be used to help control the operation of the repeater by generating an output state or state vector Si+1 1242 based on a previous state or state vector Si 1241 as will be appreciated by one of ordinary skill in the art.

When a packet is ready to be retransmitted, the SPBA 1220 and the SPBB 1221 output the baseband data to the multiplexer 1228 which selects the appropriate one of the SPBA 1220 and the SPBB 1221 for output based on which channel the signal was detected and subsequently processed on. The output of the multiplexer 1228, which is typically a 14 to 16 bit digital value is coupled to a digital-to-analog converter (DAC) 1229 which outputs an analog signal. The analog output of the DAC 1229 is coupled to a low pass filter (LPF) element 1230 to remove any quantizing noise and the output of the LPF element 1230 is coupled as a modulating input to a vector modulator (VM) 1231 a digital IF frequency signal at for example, 528 MHz to begin up-conversion. The output of the VM 1231 is input to an amplifier 1232 the output of which is coupled to a bandpass filter (BPF) element 1233. The output of BPF element 1233 is coupled to an RF switch 1234 and depending on which channel the information is to be repeated on, the RF switch 1234 will direct the signal to an output mixer 1235 or an output mixer 1236, where the modulated IF signal will be mixed with a 3006-3078 MHz signal from LO 1 1201 or an 1960-2022 MHz signal each with a 5.8 MHz offset. It will further be appreciated that under certain circumstances, signal samples from the SPBA 1220 and the SPBB 1221 can be stored in a memory such as a memory 1250.

As will be appreciated by one of ordinary skill in the art, an exemplary physical layer repeater is capable of receiving two different frequencies simultaneously, determining which channel is carrying a signal associated with, for example, the transmission of a packet, translating from the original frequency channel to an alternative frequency channel and retransmitting the frequency translated version of the received signal on the alternative channel. Details of basic internal repeater operation in accordance with various embodiments may be found, for example, in co-pending PCT Application No. PCT/US03/16208.

The physical layer repeater can receive and transmit packets at the same time on different frequency channels thereby extending the coverage and performance of the connection between an AP and a client, and between peer-to-peer connections such as from one client unit to another client unit. When many units are isolated from one another, the repeater further acts as a wireless bridge allowing two different groups of units to communicate where optimum RF propagation and coverage or, in many cases, any RF propagation and coverage was not previously possible.

Figure 13:
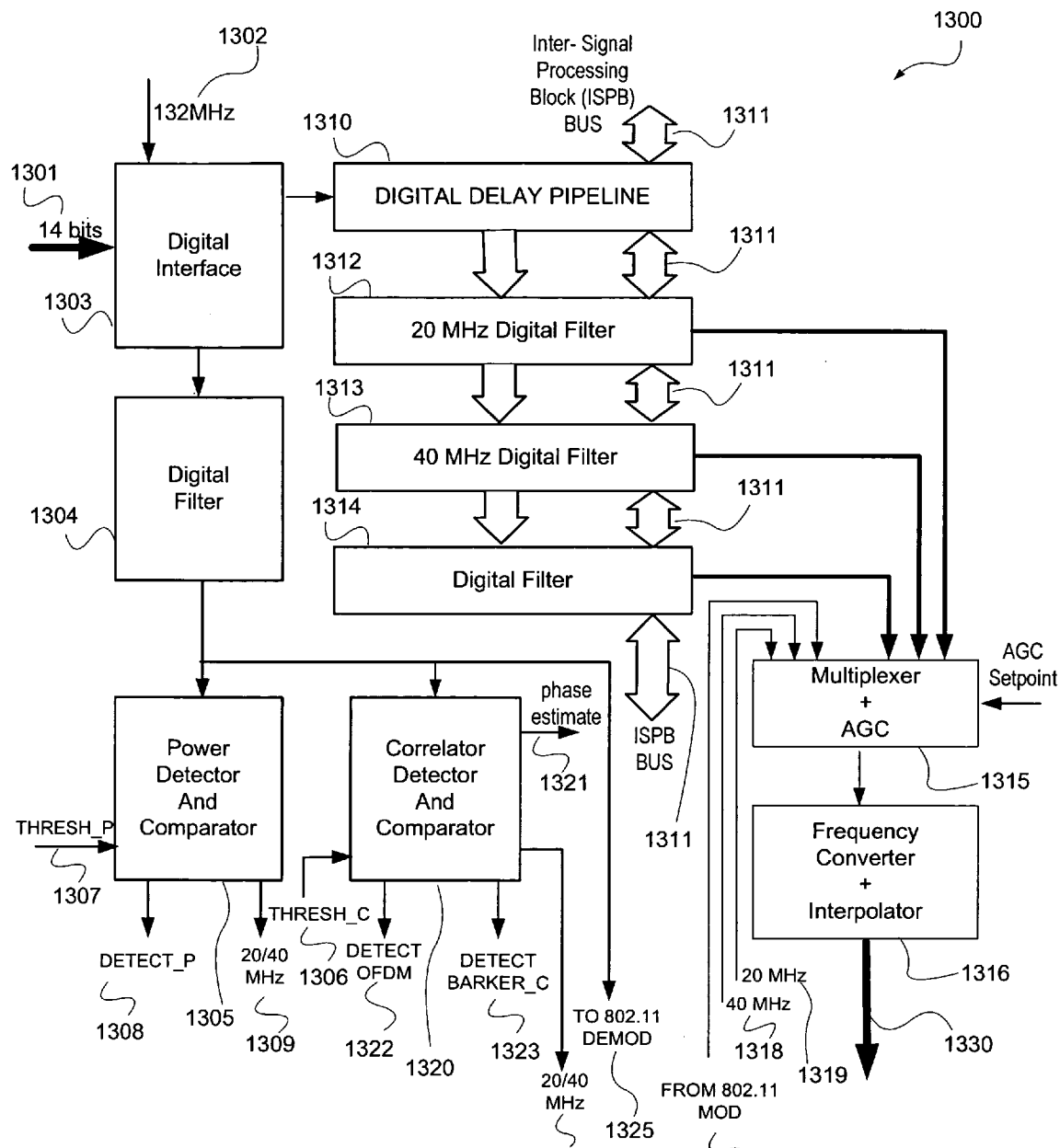
FIG. 13 is a circuit diagram further illustrating various hardware components associated with signal processing in an exemplary repeater configuration capable of implementing a discrete time filtering in accordance with the present invention.

In order to facilitate the operation of the repeater, and to replace certain expensive components such as surface acoustic wave (SAW) filters, a series of digital signal processing functions can be used to perform, for example, detection and delay. As shown in FIG. 13, a physical layer repeater scenario 1300 is shown where various digital filter components are connected to provide filtering functions. Digital data 1301 received from, for example, an ADC, can be input at a digital interface 1303 according to data clock 1302 at a clocking rate of 132 MHz. Portions of the digital signal can be input to an auxiliary digital filter 1304 the output of which can be used, inter alia, for power detection at a power detector and comparator 1305. The signal level threshold for at least initial or coarse detection can be established in the power detector and comparator 1305 with a threshold THRESH_P 1307. The output of the power detector and comparator 1306 would accordingly be a signal indicative that the threshold has been crossed such as a DETECT_P 1308 signal. A coarse channel width detection signal can also be output as a 20/40 MHz 1309 signal. The digital signal can also be coupled to a correlator detector and comparator 1320, which receives the filtered output signal from the auxiliary digital filter 1304. The correlator detector and comparator 1320 can be provided with a comparator threshold input such as a THRESH_C 1306. The correlator detector and comparator 1320 determines the presence of orthogonal frequency division multiplexing (OFDM) and the presence of a barker signal indicating the use of direct sequence (DS) spread spectrum modulation. Accordingly, the output of the correlator detector and comparator 1320 is an OFDM DETECT signal 1322, a BARKER_C DETECT signal 1323, and a phase estimate 1321. The correlator detector and comparator 1320 can also output a more refined indication of the channel width for example as a 20/40 MHZ signal 1324. The processed outputs 1325 can be forwarded to an 802.11 demodulator.

The digital signal 1301 can also be forwarded to a digital delay pipeline 1310, where it can be delayed until certain processing has been conducted as will be appreciated. A 20 MHz digital filter 1312 can be used to process a signal transmitted on a 20 MHz channel or a 40 MHz digital filter 1313 can be used to process a signal transmitted on a 40 MHz channel. An additional digital filter 1314 can be used to conduct additional filtering. The digital filters can be coupled to each other and to additional signal processing blocks such as the signal processing blocks A 1220 and B 1221 as shown in FIG. 12, through an inter signal processing block (ISPB) bus 1311 which is also shown in FIG. 12 as the bus 1222. For repeating, the output of the appropriate one or more of the digital filters can be input to multiplexer 1315 where control inputs for 40 MHz 1318 and 20 MHz 1319 can be used to select which of the filter outputs will be transmitted. The output of a modulator can also be coupled to the multiplexer 1315 for transmitting information demodulated from the signal if appropriate. The output of the multiplexer 1315 is input to a frequency converter and interpolator 1316 for up conversion and output at 1330 to the RF transmitter section (not shown).

One of ordinary skill in the art will recognize that as noted above, slightly different techniques can be used to implement various portions of the discrete time analog bandpass filter including filters, switches, delay lines, and the like in the present invention. Additionally, various components, could be combined into a single integrated device such as a mixed signal integrated circuit or the like. Other changes and alterations to specific components, and the interconnections thereof, can be made by one of ordinary skill in the art without deviating from the scope and spirit of the present invention.

What is claimed is:

1. A repeater for conducting a repeating operation in an environment associated with a wireless network, the repeating operation including receiving a signal associated with a packet and transmitting the packet without modification of one or more of a source address and a destination address contained in the packet, the repeater comprising:
   a digital baseband section including a signal processor and a detector; and
   a processor coupled to and capable of controlling the baseband section, the processor configured to:
      detect the presence of the signal associated with the packet on one of at least two frequency channels; and
      delay the repeating operation using the signal processor, wherein the signal processor includes a digital delay line and a digital filter and wherein the detection and delay are performed in parallel during the repeating operation.

2. The repeater according to claim 1, wherein the signal processor includes one or more of: a preliminary filter stage configured to perform one of a decimation function and a delay function associated with the signal to provide a decimated signal; an intermediate filter stage configured to perform a bandpass filtering of the decimated signal to provide a filtered signal; and a terminal filter stage configured to provide one or more of an interpolation and a delay of the filtered signal to provide an output signal.

3. A repeater according to claim 2, wherein one of a sampling rate, a center frequency, a pass bandwidth, a stop bandwidth, a stop band attenuation, a group delay, and a frequency response associated with the one or more of the preliminary filter stage, the intermediate filter stage, and the terminal filter stage is adjustable.

4. A repeater in accordance with claim 2, wherein a stop band attenuation associated with the one or more of the preliminary filter stage, the intermediate filter stage, and the terminal filter stage is adjustable, wherein different predetermined stop band attenuation adjustment values are associated with different frequency ranges so as to reject known signals.

5. A repeater in accordance with claim 2, wherein a frequency response associated with the one or more of the preliminary filter stage, the intermediate filter stage, and the terminal filter stage is adaptive so as to minimize an error signal generated in the one or more of the preliminary filter stage, the intermediate filter stage, and the terminal filter stage.

6. A repeater in accordance with claim 1, wherein the digital delay line includes a continuous amplitude sampled delay line.

7. A repeater in accordance with claim 1, wherein the digital filter includes a continuous amplitude filter.

8. A repeater in accordance with claim 1, wherein the digital filter is coupled to one or more of a resistor ratio and a variable resistive structure, each including a Field Effect Transistor and being capable of generating a sum of weighted currents derived from an output of the digital delay line.

9. A repeater in accordance with claim 1, wherein:
   the digital delay line generates a plurality of samples; and
   the detector is coupled to the digital delay line in parallel with the digital filter, the detector configured to use the plurality of samples for the detection.

10. A repeater in accordance with claim 1, wherein the digital delay line is configured to compensate for a detection delay associated with the detector such that a control action associated with the repeater operation is capable of being performed prior to the signal being available at an output of the digital delay line.

11. A repeater in accordance with claim 1, wherein the detector includes one or more of a correlator, a power detector, and an automatic gain control circuit.

12. A repeater in accordance with claim 1, wherein the detector includes a power detector and an automatic gain control circuit, the power detector generates a power detection output signal, and wherein the automatic gain control circuit is configured to process the power detection output signal.

13. A discrete-time digital filter for a repeater repeating a signal associated with a packet in an RF digital communications environment, the discrete-time digital filter comprising:
   a detection unit configured to receive a detection signal; and
   a delay line configured to delay the repeating of the signal an amount of time sufficient to conduct at least one control function associated with the repeating,
   wherein the detection unit and the delay line are configured to operate in parallel during the repeating.

14. A discrete-time digital filter in accordance with claim 13, further comprising:
   a preliminary filter stage configured to provide one or more of a decimation and a delay of the transmit signal to provide a decimated transmit signal;
   an intermediate filter stage configured to bandpass filter the decimated transmit signal to provide a filtered decimated transmit signal; and
   a terminal filter stage configured to provide one or more of an interpolation and a delay of the filtered decimated transmit signal,
   wherein the digital delay line and the detection unit are configured to operate in parallel with one or more of the preliminary filter stage, the intermediate filter stage, and the terminal filter stage.

15. A discrete-time filter in accordance with claim 14, wherein one of a sampling rate, a center frequency, a pass bandwidth, a stop bandwidth, a stop band attenuation, a group delay, and a frequency response associated with the one or more of the preliminary filter stage, the intermediate filter stage, and the terminal filter stage is adjustable.

16. A discrete-time filter in accordance with claim 14, wherein a stop band attenuation associated with the one or more of the preliminary filter stage, the intermediate filter stage, and the terminal filter stage is adjustable, wherein different predetermined stop band attenuation adjustments are associated with different frequency ranges so as to eliminate known interfering signals from the transmit signal.

17. A discrete-time filter in accordance with claim 14, wherein a frequency response associated with the one or more of the preliminary filter stage, the intermediate filter stage, and the terminal filter stage is adaptive so as to minimize an error signal generated in the one or more of the preliminary filter stage, the intermediate filter stage, and the terminal filter stage.

18. A discrete-time filter in a wireless repeater, comprising:
a digital detector,
a digital delay line; and
multiple filter stages including a decimating filter, an interpolating filter, and a single-rate filter,
wherein
the digital detector, the digital delay line, and the multiple filter stages are configured to operate in parallel, and
a passband associated with the discrete time filter is translated between a first frequency range and a second frequency range by multiplying a frequency characteristic associated with the decimating filter, the interpolating filter, and the single-rate filter by a periodic signal.

19. A repeater for conducting a repeating operation in an environment associated with a wireless network, the repeating operation including receiving a signal associated with a packet and transmitting the packet without modification of one or more of a source address and a destination address contained in the packet, the repeater comprising:
means for detecting the presence of the signal associated with the packet on one of at least two frequency channels; and
means for delaying the repeating operation using the signal processor, wherein the signal processor includes a digital delay line and a digital filter and wherein the detection and delaying performed by the means for detecting and the means for delaying, respectively, are performed in parallel during the repeating operation.

20. The repeater of claim 19 wherein the means for delaying delays the transmission of the packet an amount of time sufficient to conduct at least one control function associated with the repeating operation.

21. A method of operating a repeater to conduct a repeating operation in an environment associated with a wireless network, comprising:
receiving a signal associated with a packet;
detecting the presence of the signal associated with the packet on one of at least two frequency channels;
delaying a transmission of the packet; and
transmitting, after the delay, the packet without modification of one or more of a source address and a destination address contained in the packet,
wherein the detecting step and delaying step are performed in parallel.

22. The method of claim 21, wherein the delaying step delays the transmission of the packet an amount of time sufficient to conduct at least one control function associated with the repeating operation.

* * * * *